US012692785B2

(12) United States Patent
Baig

(10) Patent No.: US 12,692,785 B2
(45) Date of Patent: Jul. 28, 2026

(54) SYSTEMS AND METHODS FOR APPLICATION OF STATISTICAL CLASSIFICATION AND PATTERN RECOGNITION FOR COMPARTMENT DESIGN IN HORIZONTAL OIL WELLS

(71) Applicant: Saudi Arabian Oil Company, Dhahran (SA)

(72) Inventor: Raheel R. Baig, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 1041 days.

(21) Appl. No.: 17/871,132

(22) Filed: Jul. 22, 2022

(65) Prior Publication Data

US 2024/0026778 A1     Jan. 25, 2024

(51) Int. Cl.
| | |
|---|---|
| *E21B 47/12* | (2012.01) |
| *G06F 30/20* | (2020.01) |
| *G06G 7/122* | (2006.01) |

(52) U.S. Cl.
CPC .............. *E21B 47/12* (2013.01); *G06F 30/20* (2020.01); *G06G 7/122* (2013.01)

(58) Field of Classification Search
CPC .......... G06F 30/20; E21B 47/12; G06G 7/122
(Continued)

(56) References Cited

U.S. PATENT DOCUMENTS

| | | | |
|---|---|---|---|
| 8,127,845 B2 | 3/2012 | Assal | |
| 2006/0237197 A1* | 10/2006 | Dale | E21B 43/14 166/236 |

(Continued)

FOREIGN PATENT DOCUMENTS

| | | |
|---|---|---|
| CA | 2819371 C | 11/2016 |
| CN | 103688015 B | 9/2016 |

(Continued)

OTHER PUBLICATIONS

Akbari et al., "Considerations for Optimum Inflow Control Devices (ICSs) Selection and Placement in Horizontal Sections", SPE-171281-MS, 14 pgs., 2014.
(Continued)

*Primary Examiner* — Andre Pierre Louis

(74) *Attorney, Agent, or Firm* — Dinsmore & Shohl, LLP

(57) ABSTRACT

Systems and methods for application of statistical classification and pattern recognition for compartment design in horizontal oil wells. One embodiment includes a drill for drilling a target well and a computing device that includes a memory component that stores logic that causes the computing device to receive an input parameter for the target well, perform a log transformation on the permeability log to create transformed data, and calculate a mean and a standard deviation of the transformed data. Some embodiments generate a classification flag that classifies the permeability log, based on the standard deviation, classify noise from the permeability log, and transform the noise based on a predefined pattern library. Some embodiments create a final transformed signal from the classification flag and the noise and generate a compartment design from the final transformed signal that provides recommended compartment intervals versus measured depth of the target well.

15 Claims, 21 Drawing Sheets

(58) Field of Classification Search
USPC .................................................. 703/2, 9, 10
See application file for complete search history.

(56) References Cited

U.S. PATENT DOCUMENTS

| | | | |
|---|---|---|---|
| 2011/0022368 A1 | 1/2011 | Huang et al. | |
| 2016/0319627 A1* | 11/2016 | Blekhman | E21B 33/12 |
| 2018/0202262 A1* | 7/2018 | Rahmes | G01V 5/12 |
| 2018/0240021 A1* | 8/2018 | Al-Harbi | G06F 30/20 |
| 2021/0032986 A1* | 2/2021 | Jones | E21B 49/10 |

FOREIGN PATENT DOCUMENTS

| | | |
|---|---|---|
| WO | 2012027020 A1 | 3/2012 |
| WO | 2018194560 A1 | 10/2018 |

OTHER PUBLICATIONS

Gavioli et al., "Design, Analysis, and Diagnostics for Passive Inflow Control Devices with Openhole Packer Completions", OCT20348, 20 pgs., 2010.

Gavioli et al., "The Evolution of the Role of Openhole Packers in Advanced Horizontal Completions: From Optional Accessory to Critical Key of Success", SPE132846, 27 pgs., 2010.

Gurses et al., "Optimized Modeling Workflows for Designing Passive Flow Control Devices in Horizontal Wells", SPE166052, 10 pgs., 2013.

Liang-Biao et al., "Practical Consideration of an Inflow Control Device Application for Reducing Water Production", SPE124154, 19 pgs., 2009.

* cited by examiner

COMP NUM AUTO

CLASS FLAG PAT R

PERM

Low          High

Measured Depth, ft

1000

1010

1020

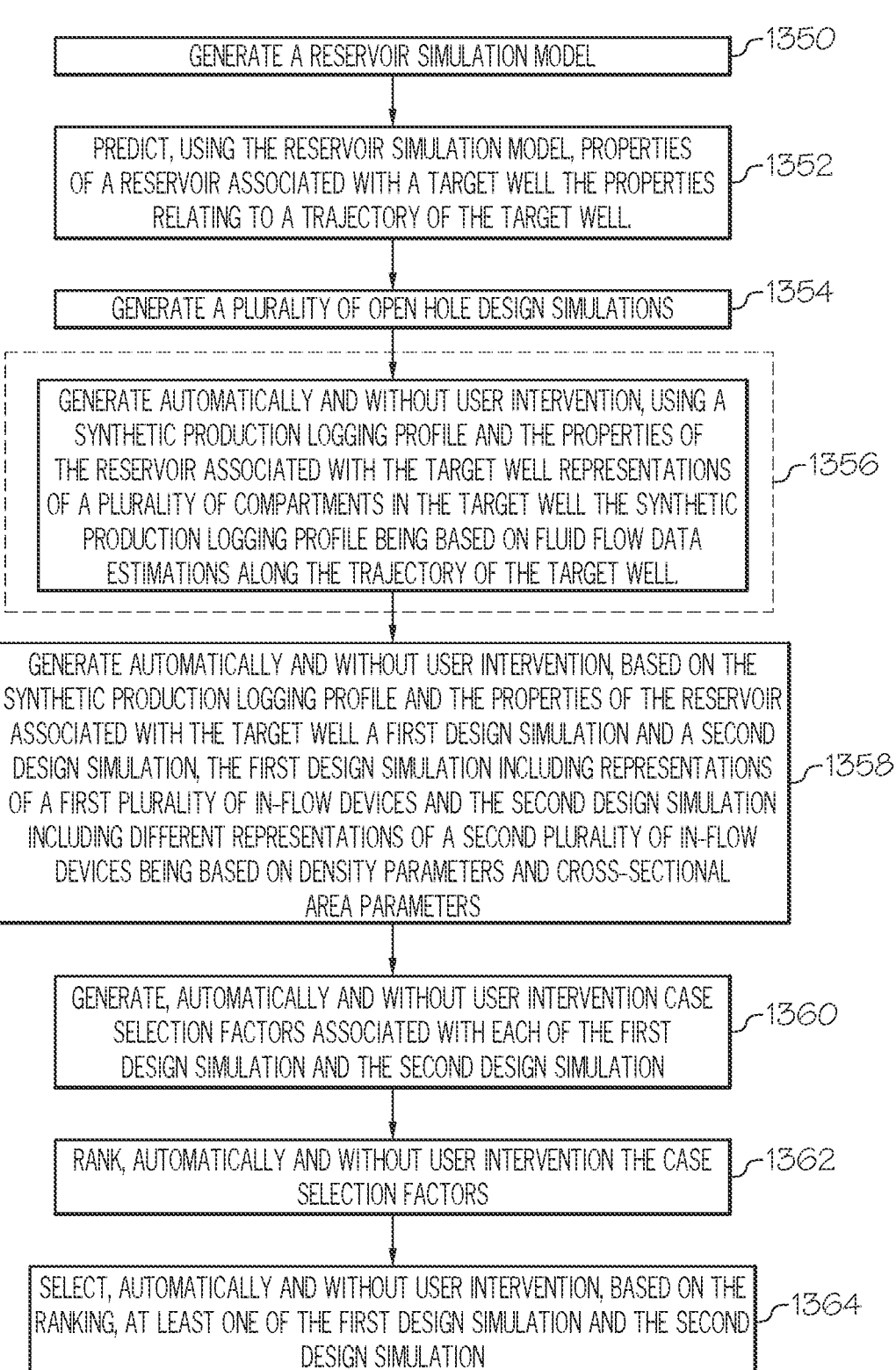

GENERATE A RESERVOIR SIMULATION MODEL ⟋1350

PREDICT, USING THE RESERVOIR SIMULATION MODEL, PROPERTIES OF A RESERVOIR ASSOCIATED WITH A TARGET WELL THE PROPERTIES RELATING TO A TRAJECTORY OF THE TARGET WELL. ⟋1352

GENERATE A PLURALITY OF OPEN HOLE DESIGN SIMULATIONS ⟋1354

GENERATE AUTOMATICALLY AND WITHOUT USER INTERVENTION, USING A SYNTHETIC PRODUCTION LOGGING PROFILE AND THE PROPERTIES OF THE RESERVOIR ASSOCIATED WITH THE TARGET WELL REPRESENTATIONS OF A PLURALITY OF COMPARTMENTS IN THE TARGET WELL THE SYNTHETIC PRODUCTION LOGGING PROFILE BEING BASED ON FLUID FLOW DATA ESTIMATIONS ALONG THE TRAJECTORY OF THE TARGET WELL. ⟋1356

GENERATE AUTOMATICALLY AND WITHOUT USER INTERVENTION, BASED ON THE SYNTHETIC PRODUCTION LOGGING PROFILE AND THE PROPERTIES OF THE RESERVOIR ASSOCIATED WITH THE TARGET WELL A FIRST DESIGN SIMULATION AND A SECOND DESIGN SIMULATION, THE FIRST DESIGN SIMULATION INCLUDING REPRESENTATIONS OF A FIRST PLURALITY OF IN-FLOW DEVICES AND THE SECOND DESIGN SIMULATION INCLUDING DIFFERENT REPRESENTATIONS OF A SECOND PLURALITY OF IN-FLOW DEVICES BEING BASED ON DENSITY PARAMETERS AND CROSS-SECTIONAL AREA PARAMETERS ⟋1358

GENERATE, AUTOMATICALLY AND WITHOUT USER INTERVENTION CASE SELECTION FACTORS ASSOCIATED WITH EACH OF THE FIRST DESIGN SIMULATION AND THE SECOND DESIGN SIMULATION ⟋1360

RANK, AUTOMATICALLY AND WITHOUT USER INTERVENTION THE CASE SELECTION FACTORS ⟋1362

SELECT, AUTOMATICALLY AND WITHOUT USER INTERVENTION, BASED ON THE RANKING, AT LEAST ONE OF THE FIRST DESIGN SIMULATION AND THE SECOND DESIGN SIMULATION ⟋1364

FIG. 13

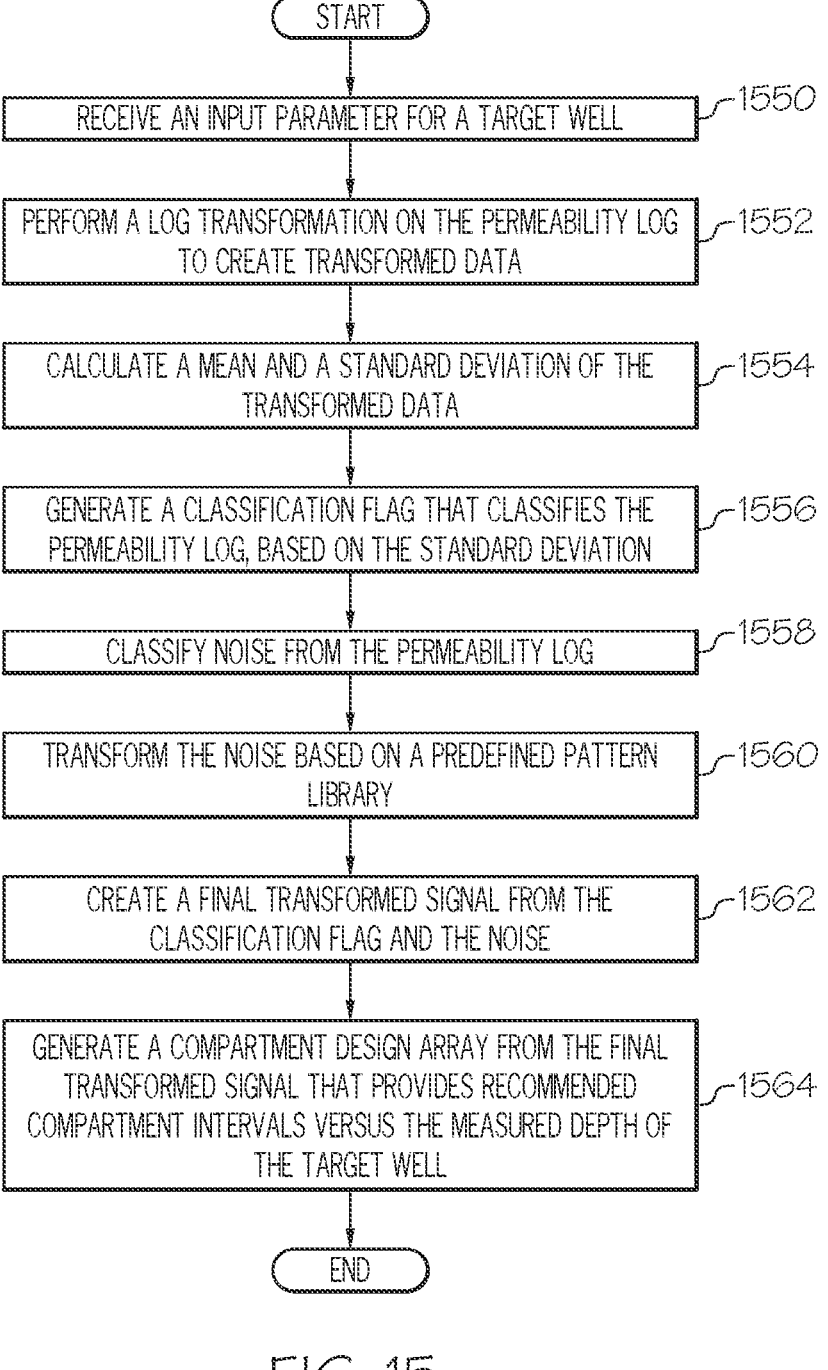

START

RECEIVE AN INPUT PARAMETER FOR A TARGET WELL — 1550

PERFORM A LOG TRANSFORMATION ON THE PERMEABILITY LOG TO CREATE TRANSFORMED DATA — 1552

CALCULATE A MEAN AND A STANDARD DEVIATION OF THE TRANSFORMED DATA — 1554

GENERATE A CLASSIFICATION FLAG THAT CLASSIFIES THE PERMEABILITY LOG, BASED ON THE STANDARD DEVIATION — 1556

CLASSIFY NOISE FROM THE PERMEABILITY LOG — 1558

TRANSFORM THE NOISE BASED ON A PREDEFINED PATTERN LIBRARY — 1560

CREATE A FINAL TRANSFORMED SIGNAL FROM THE CLASSIFICATION FLAG AND THE NOISE — 1562

GENERATE A COMPARTMENT DESIGN ARRAY FROM THE FINAL TRANSFORMED SIGNAL THAT PROVIDES RECOMMENDED COMPARTMENT INTERVALS VERSUS THE MEASURED DEPTH OF THE TARGET WELL — 1564

END

FIG. 15

SYSTEMS AND METHODS FOR APPLICATION OF STATISTICAL CLASSIFICATION AND PATTERN RECOGNITION FOR COMPARTMENT DESIGN IN HORIZONTAL OIL WELLS

TECHNICAL FIELD

Embodiments described herein generally relate to systems and methods for application of statistical classification and pattern recognition for compartment design in horizontal oil wells and, more specifically, to embodiments for designing compartments in a horizontal oil well.

BACKGROUND

Horizontal oil wells provide increased reservoir contact and higher well productivity, but horizontal oil wells can suffer with uneven inflow along the well trajectory due to reservoir heterogeneity, resulting in premature water breakthrough. Therefore, horizontal oil wells completions often involve installing inflow control devices (ICD) for inflow equalization and delaying water breakthrough thereby increasing oil recovery from the wells.

The process of designing ICD completions involves placement of packers, such as reservoir isolation devices, at appropriate intervals of the horizontal section of the well. This establishes a number of inflow compartments in the completions design, as well as a length of each individual compartment. Appropriate design of compartments helps ensure effective inflow equalization along the well trajectory from target entry (TE) depth to target depth (TD). The higher the reservoir heterogeneity, the greater the number of compartments may be required for effective inflow equalization.

The traditional approach usually involves an engineer identifying packer placement locations by visual analysis of the well permeability log plotted on a log scale along the measured depth (MD) of the well trajectory. The engineer would normally create compartment intervals grouping similar magnitude of permeability.

This traditional approach has the challenge of being subjective to the interpretation of an engineer. Further, in a forecast optimization study utilizing reservoir simulation, multiple well completions designs may need to be developed with a custom design for each well due to the variation in reservoir permeability at each well location. As a field development plan may involve hundreds of wells, the process of designing compartments customized to each well can be a very tedious task.

SUMMARY

Systems and methods for application of statistical classification and pattern recognition for compartment design in horizontal oil wells are described. One embodiment includes a drill for drilling a target well and a computing device that includes a memory component that stores logic that causes the computing device to receive an input parameter for the target well, perform a log transformation on the permeability log to create transformed data, and calculate a mean and a standard deviation of the transformed data. Some embodiments generate a classification flag that classifies the permeability log, based on the standard deviation, classify noise from the permeability log, and transform the noise based on a predefined pattern library. Some embodiments create a final transformed signal from the classification flag and the noise and generate a compartment design from the final transformed signal that provides recommended compartment intervals versus measured depth of the target well.

In another embodiment, a method includes receiving, by a computing device, an input parameter for a target well, where the input parameter includes a permeability log for the target well, performing, by the computing device, a log transformation on the permeability log to create transformed data, and calculating, by the computing device, a mean and a standard deviation of the transformed data. In some embodiments, the method includes generating, by the computing device, a classification flag that classifies the permeability log, based on the standard deviation, classifying, by the computing device, noise from the permeability log, and transforming, by the computing device, the noise based on a predefined pattern library. In some embodiments, the method includes creating, by the computing device, a final transformed signal from the classification flag and the noise and generating, by the computing device, a compartment design from the final transformed signal that provides a recommended compartment interval versus measured depth of the target well.

In yet another embodiment, a system includes drilling equipment for drilling a target well, wherein the target well is a horizontal well, where the drilling equipment includes a special purpose computing device that includes a memory component. The memory component may store logic, that when executed by the special purpose computing device, causes the system to receive an input parameter for the target well, where the input parameter includes a permeability log for the target well, perform a log transformation on the permeability log to create transformed data, and calculate a mean and a standard deviation of the transformed data. In some embodiments, the logic may cause the system to generate a classification flag that classifies the permeability log, based on the standard deviation, classify noise from the permeability log, and transform the noise based on a predefined pattern library. In some embodiments, the logic causes the system to create a final transformed signal from the classification flag and the noise and generate a compartment design from the final transformed signal that provides recommended compartment intervals versus measured depth of the target well.

These and additional features provided by the embodiments of the present disclosure will be more fully understood in view of the following detailed description, in conjunction with the drawings.

BRIEF DESCRIPTION OF THE DRAWINGS

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which:

FIG. 13 depicts a flowchart for selecting a design simulation, according to embodiments provided herein, according to embodiments provided herein;

FIG. 15 depicts another flowchart for statistical classification and pattern recognition for compartment design in horizontal oil wells, according to embodiments provided herein.

DETAILED DESCRIPTION

Embodiments disclosed herein include systems and methods for application of statistical classification and pattern recognition for compartment design in horizontal oil wells. Embodiments provided herein address challenges described above by a process of compartmentalization of a permeability log based on statistical analysis and signal processing techniques. These embodiments perform automatic transformation of the permeability data to recommend placement of packers along the measured depth of the well trajectory. This solves both the challenge of human subjectivity and tedious nature of designing multiple well completions through standardization and automation.

More specifically, horizontal oil wells with complex completions, specifically employing inflow control devices (ICD), provide the potential to improve oil recovery through inflow equalization and delayed water breakthrough. For effective inflow equalization, the horizontal section of the well may be divided into compartments based on variation of reservoir properties such as permeability.

Accordingly, some embodiments provide a computing device that may design well inflow compartments without human intervention. In some embodiments, the computing device performs a statistical analysis of a permeability log for the target well which follows in nature a log normal distribution. The computing device may perform a log transformation on the permeability data. Then, the computing device may calculate mean and standard deviation of transformed data which is used in calculation of a new property, log perm mean deviation, by subtracting the mean from the log permeability. The computing device may create a flag signal classifying the log permeability based on intervals of standard deviation. These embodiments may additionally transform a classification flag created at the log sampling resolution to the resolution of one joint length of a completion design using a sliding window process employing a most-of methodology.

The signal may be further transformed with the application of pattern recognition that identifies at least one interval below a user-specified minimum compartment length and automatically classifies the noise based on a pattern of interval$-1$ and interval$+1$ value and further transforms the noise based on a predefined pattern library.

Additionally, a compartment design array is generated from the transformed signal that forms the basis of automatic generation of compartment intervals along the measured depth of the target well. The systems and methods for application of statistical classification and pattern recognition for compartment design in horizontal oil wells incorporating the same will be described in more detail, below.

Figure 1:
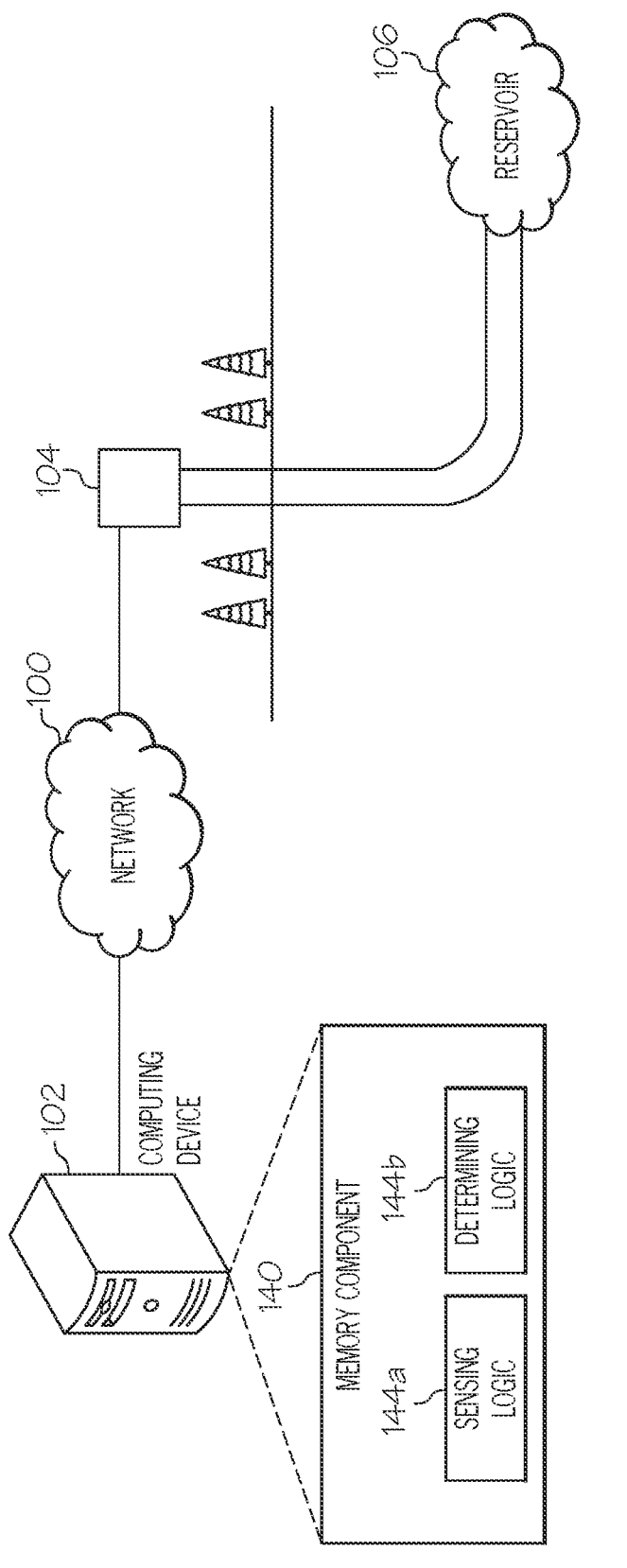
FIG. 1 depicts a computing environment for application of statistical classification and pattern recognition for compartment design in horizontal oil wells, according to embodiments provided herein.

Referring now to the drawings, FIG. 1 depicts a computing environment for application of statistical classification and pattern recognition for compartment design in horizontal oil wells, according to embodiments provided herein. As illustrated, the drilling environment includes a network 100 that is coupled to both a computing device 102 and drilling equipment 104.

The network 100 may be configured as any wide area network (such as PSTN, mobile network, the internet, satellite network, etc.), local network (such as wireless fidelity, local area network, etc.) and/or any peer to peer network (such as a ZigBee, near field communication, a wired connection, etc.). Regardless, the network 100 may permit the computing device 102 to be located remote from the drilling equipment 104; however some embodiments are configured with the network 100 representing a connection of an integrated, special purpose computer with the drilling equipment 104.

The computing device 102 may be configured as a personal computer, laptop, tablet, mobile device, integrated special purpose computer, programmable logic controller (PLC) and/or other type of computing device for providing the functionality provided herein. As such, the computing device 102 may include a memory component 140 that stores sensing logic 144a and determining logic 144b. Additional components of the computing device 102 are described with reference to FIG. 14. It should be noted that while depicted in FIG. 1 as a general purpose computer, some embodiments of the computing device 102 may be a special purpose computing device that is integrated into the drilling equipment 104.

The drilling equipment 104 may be configured as any hardware for drilling a horizontal well into a reservoir 106, such as a hydrocarbon reservoir. The drilling equipment 104 may include one or more hardware components for drilling the well and installing an ICD completion, as described herein. The determining logic 144b may cause the computing device 102 to utilize that data to predict a likelihood of success for one or more logging tools, as described in more detail below.

It should be understood that while not explicitly depicted in FIG. 1, one or more sensors may be utilized for collecting input data. The sensor includes any of a plurality of different sensors for detecting temperature, pressure, salinity, length, depth, mud type, weight, viscosity, solids, electrical stability, etc.

Figure 2:
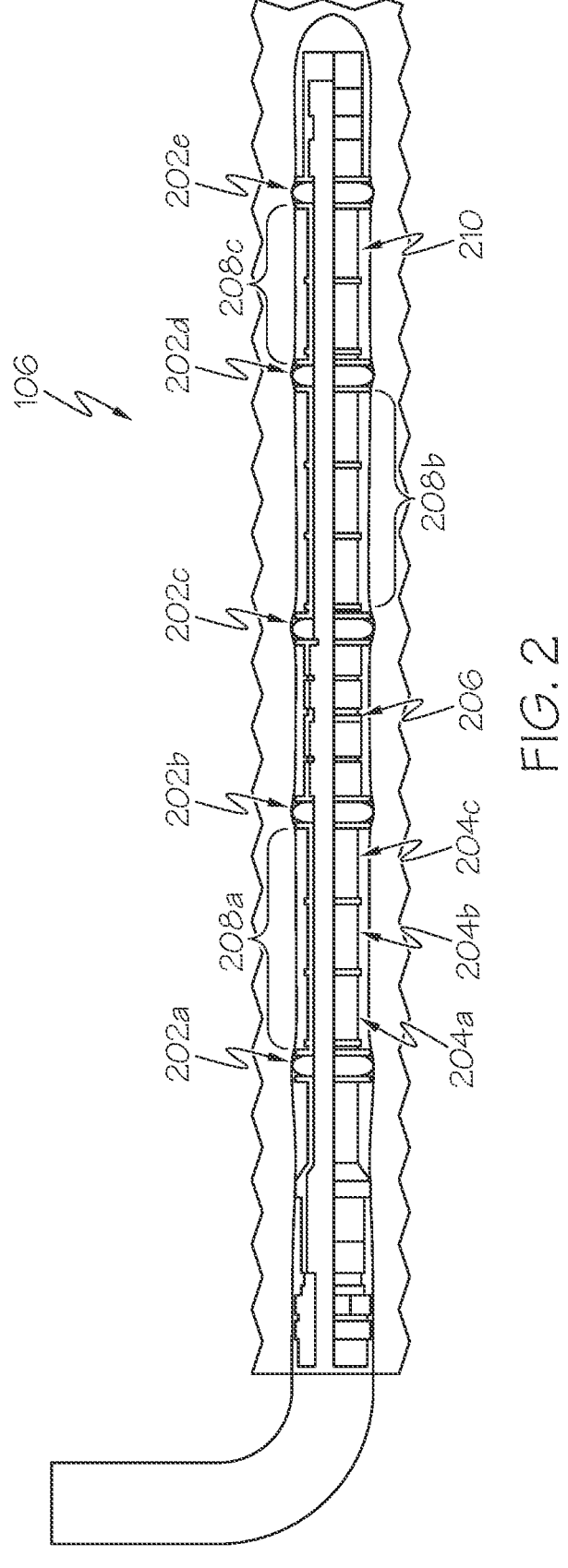
FIG. 2 depicts components of a horizontal well ICD completion, according to embodiments provided herein.

FIG. 2 depicts components of a horizontal well ICD completion, according to embodiments provided herein. As illustrated, the drilling equipment 104 from FIG. 1 drilled the reservoir 106 and installed infrastructure for the ICD completion. The infrastructure includes packers 202a-202e, ICD devices 204a-204c, a blank pipe compartment 206, flow compartments 208a-208c, and an ICD joint 210.

Designing flow compartments 208 may be part of an ICD completions design for a horizontal well. Embodiments may identify intervals of similar well properties such as permeability along the horizontal section of the target well. The intervals may be designed to be isolated with each other through the installation of packers 202. Embodiments may additionally decide on a number of ICD devices 204 to be placed in each compartment and their respective opening choke sizes.

The total number of flow compartments 208 and the size of each flow compartment 208 may be related to heterogeneity of measured permeability property along a horizontal section of the well. For example, a heterogeneous well permeability may require a greater number of flow compartments 208 of varying size, compared to a well with a lower heterogeneous permeability property. In addition, any intervals of permeability magnitude less than a predefined cut off value are considered blank pipe compartments 206, which means that no ICD devices 204 are placed in these blank pipe compartments 206.

Figure 3:
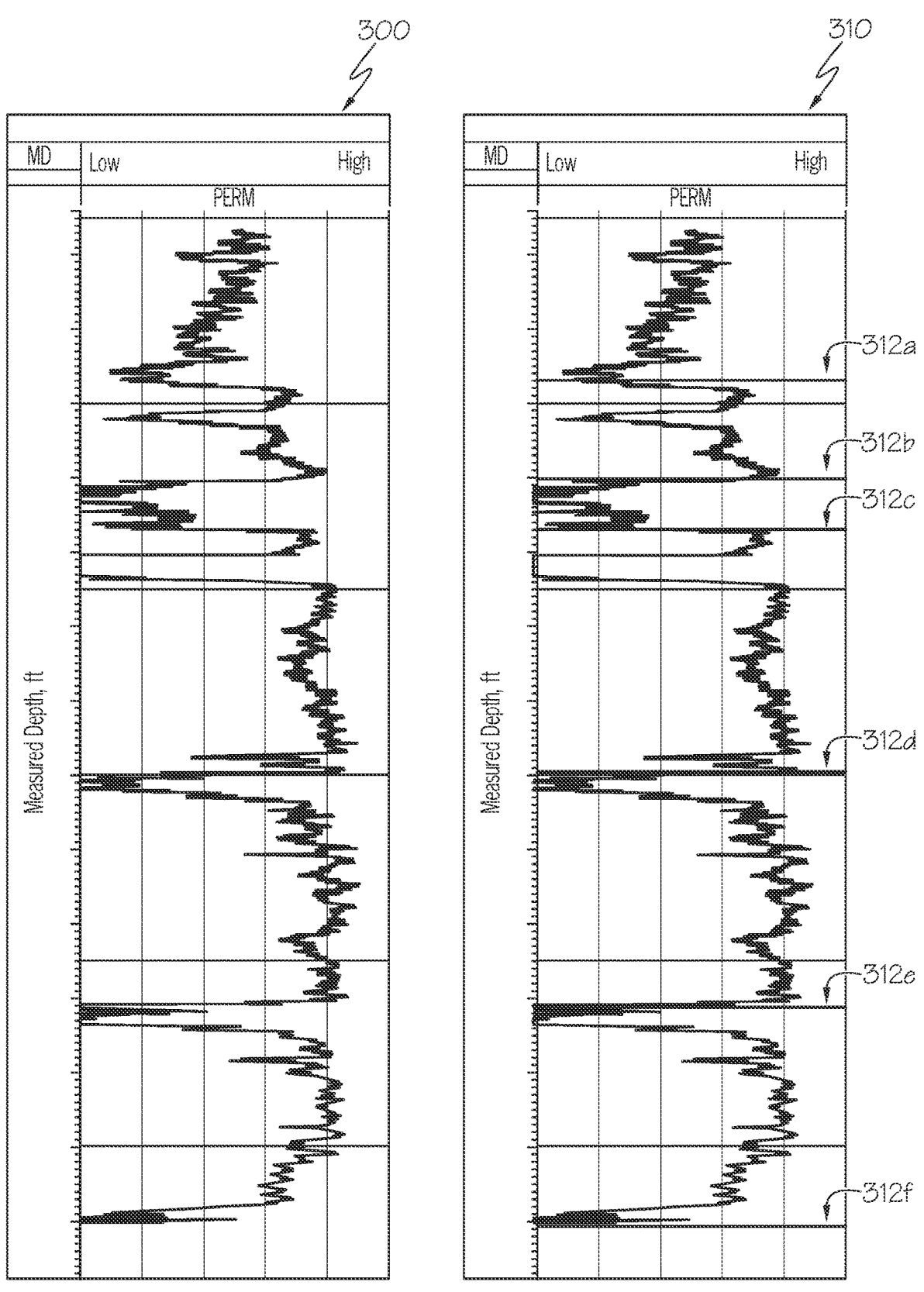
FIG. 3 depicts a plot of a well permeability log versus measured depth, and a plot of a well permeability log versus measured depth, with the placement of packers grouping similar permeability magnitude into one interval of measured depth, according to embodiments provided herein.

FIG. 3 depicts a plot 300 of a well permeability log versus measured depth, and a plot 310 of a well permeability log versus measured depth, with the placement of packers 312 grouping similar permeability magnitudes into one interval of measured depth, according to embodiments provided herein. As illustrated in the plot 300, there are several depths of the well where the permeability drops to a very low value, relative to the permeability of the remaining depths of the well. Specifically referring to the plot 310, packers 312 may be placed at those regions (e.g, 312a-3120 where the permeability is low.

Specifically, as the fluid flow in a porous subsurface reservoir, given by Darcy's law, is directly proportional to the permeability property, approximately uniform fluid flow is expected from a section of wellbore with similar permeability magnitude. Hence, for effective inflow equalization along the wellbore, embodiments provided herein compartmentalize sections of the reservoir 106 with similar magnitude of permeability so that inflow control devices (ICD) can be deployed with customized inflow settings.

An actual permeability log from a real oilfield well is typically heterogeneous, which means that the magnitude of the reservoir property varies continuously along the measured depth of the wellbore. Therefore, statistical analysis of the permeability log is utilized to standardize the process of compartmentalization. The rock permeability property is generally considered to be log-normally distributed. Embodiments provided herein utilize this characteristic of permeability to analyze and classify the measured data along the wellbore.

Figure 4A:
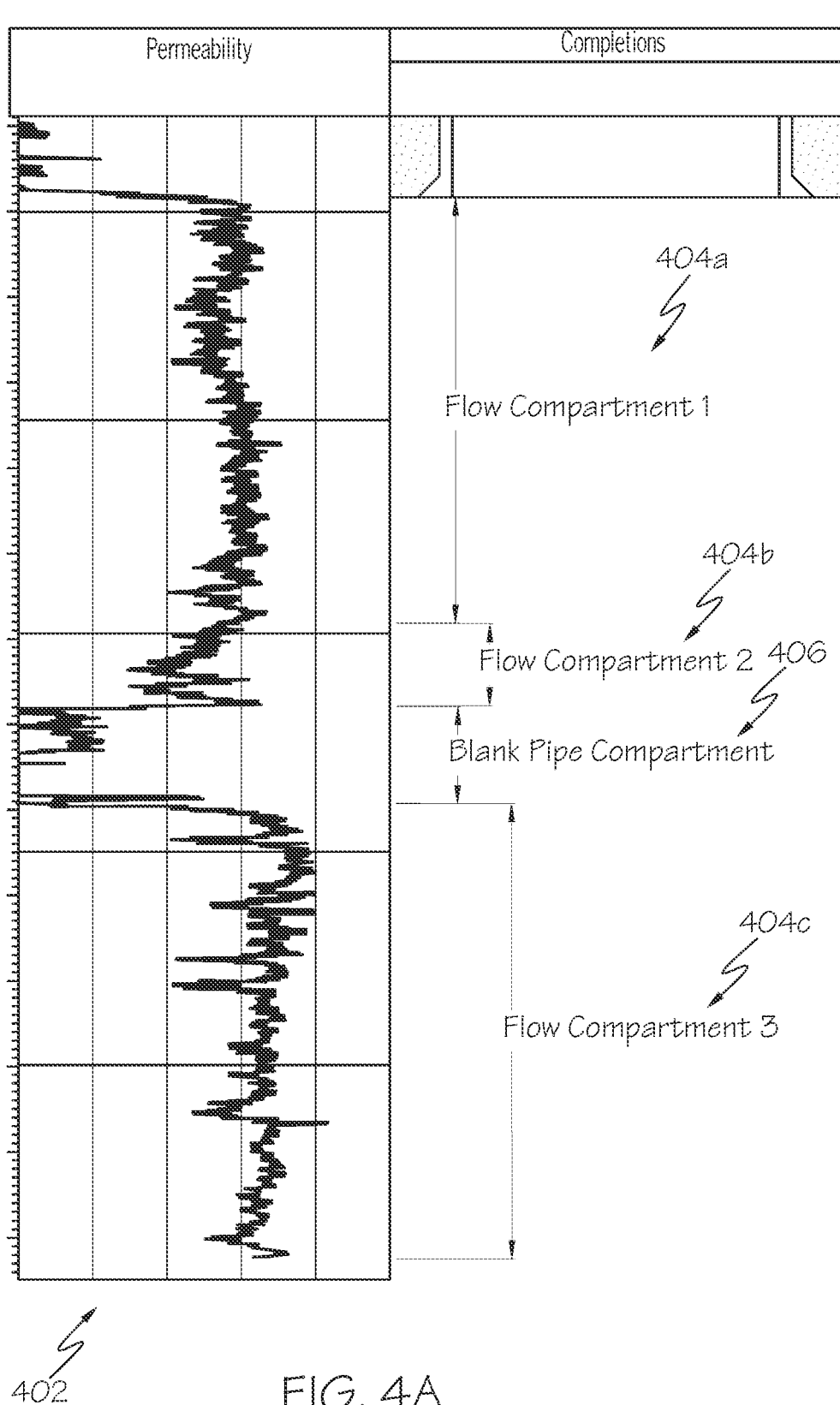
FIGS. 4A, 4B depict compartment designs for two example wells, according to embodiments provided herein.
Figure 4B:
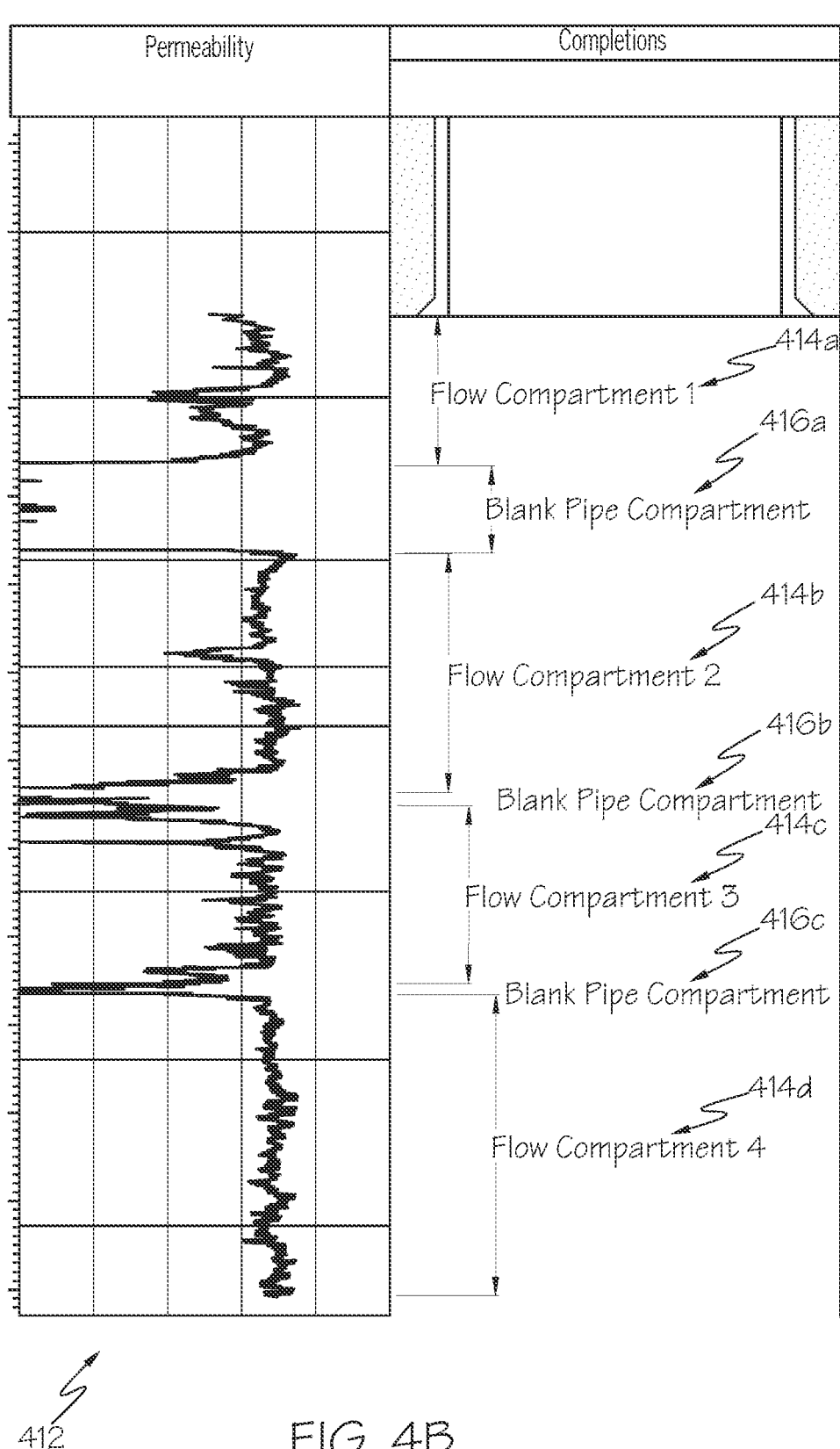

FIGS. 4A, 4B depict compartment designs for two example wells, according to embodiments provided herein. Specifically, the compartment design of FIG. 4A represents a less heterogeneous well that requires a smaller number of compartments. The compartment design of FIG. 4B represents a more heterogeneous well that requires more compartments for effective ICD design. As illustrated in FIG. 4A, the permeability versus measured depth is depicted in plot 402. Embodiments of the computing device 102 may be configured to analyze the plot 402 (and/or related data) and design the completions with a first flow compartment 404a defining the depth between two low areas of permeability. The embodiments may define a second flow compartment 404b between another two areas of low permeability. A bland pipe compartment 406 may be defined between the second flow compartment 404b and a third flow compartment 404c.

As illustrated in FIG. 4B, a plot 412 of a permeability versus measured depth for a second well is provided. In this embodiment, the second well is more heterogeneous, thus dictating a different completion design. Specifically, embodiments may define a first flow compartment 414a, which is adjacent to a first blank pipe compartment 416a. A second flow compartment 414b may then be defined between lower permeability sections of the well. A second blank pipe compartment 416b may then be disposed between the second flow compartment 414b and a third flow compartment 414c. A third blank pipe compartment 416c may be adjacent to the third flow compartment 414c and a fourth flow compartment 414d.

Embodiments are provided herein to smartly define flow compartments automatically without human intervention. To this end, the computing device 102 takes the following parameters as input: well permeability log file (permeability versus measured depth), well target entry depth (TE-DEPTH), length of a completion tubing joint (J), minimum length of a compartment (L), permeability cut-off value (K-MIN), and/or other data.

In these embodiments, the design of flow compartments in a parameterized process, such that multiple realizations of compartments design are swiftly generated. For example, varying the value of parameter L results in different unique compartment designs, which as part of the overall ICD design process results in different unique ICD completions designs.

In some embodiments, this functionality may be deployed as part of reservoir simulation based automated ICD design optimization workflow (such as the one described in US Patent, US 2021/0350035, which is incorporated by reference in its entirety).

Figures 5A, 5B, 5C:
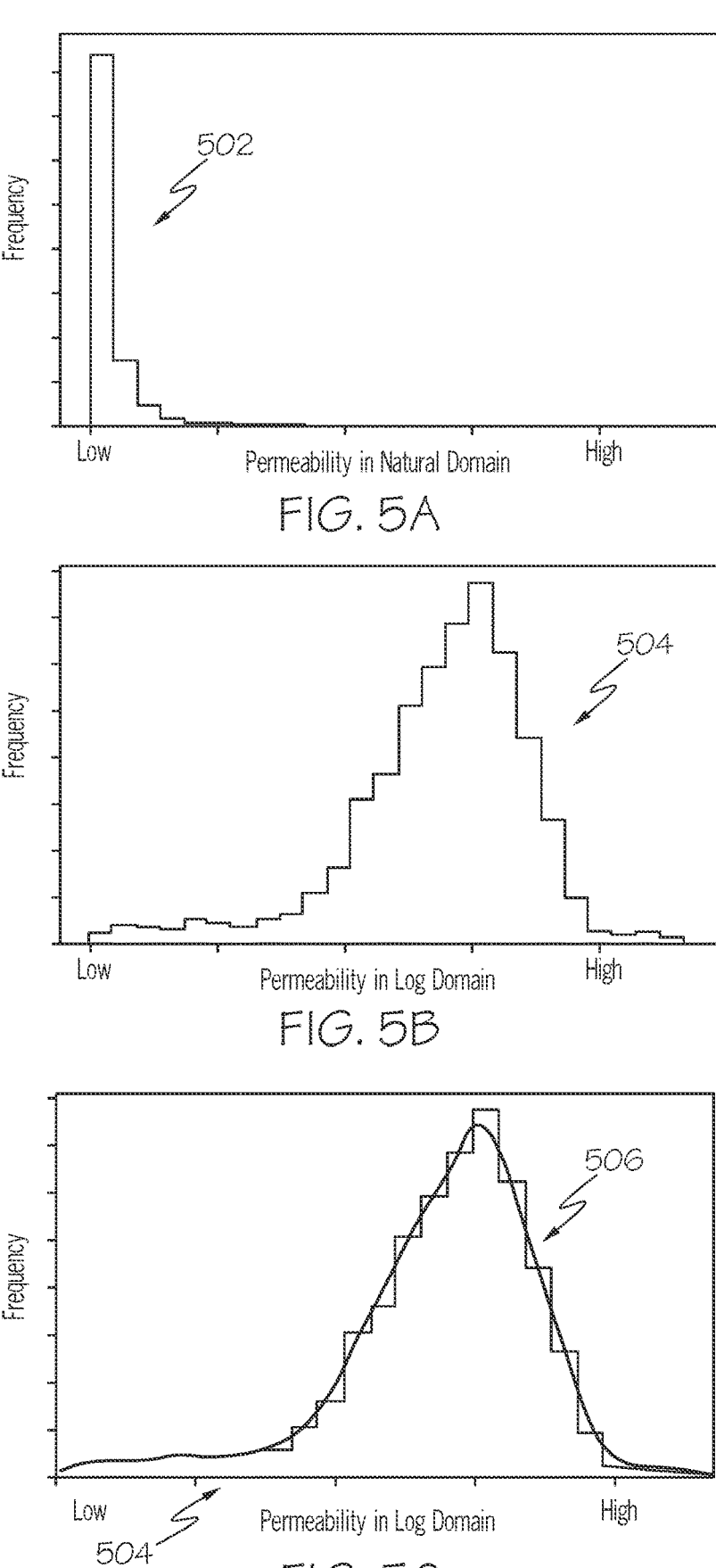
FIG. 5A depicts a histogram of well permeability log data plotted on natural scale, according to embodiments provided herein.
FIG. 5B depicts a histogram of log-transformed data that demonstrates a normal distribution, according to embodiments provided herein.
FIG. 5C depicts an estimated probability density function (PDF) plotted on the log-transformed histogram, according to embodiments provided herein.

FIG. 5A depicts a histogram 502 of well permeability log data plotted on natural scale, according to embodiments provided herein. As illustrated, the histogram 502 of a typical permeability log is shown in natural scale on the left where it does not exhibit a normal distribution. However, when the data is log transformed to the base 10 in FIG. 5B, the distribution appears to be a normal distribution. An estimated probability density function (PDF) plotted on the log transformed histogram 506 in FIG. 5C confirms a slightly left skewed log-normal distribution.

Figure 6A:
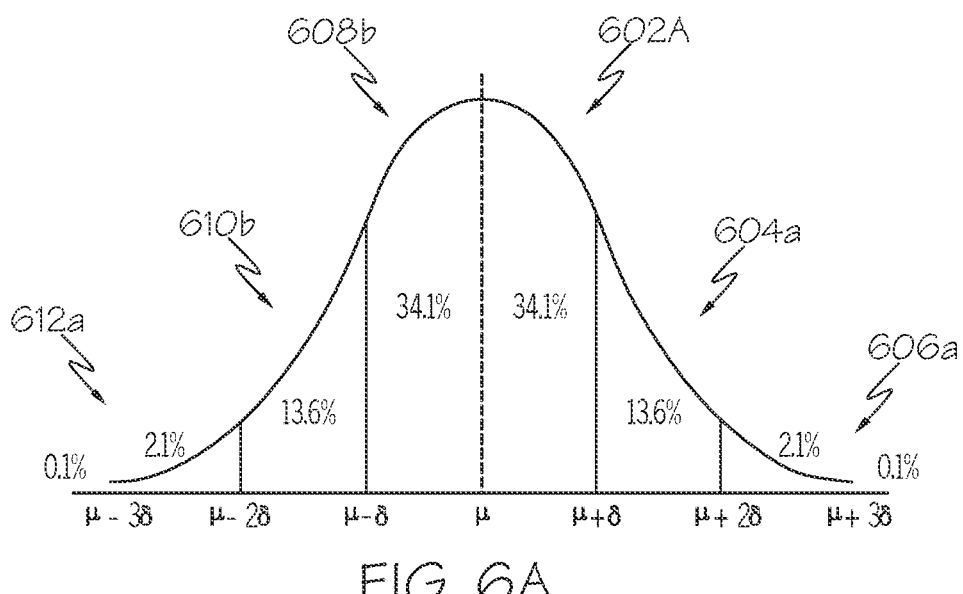
FIG. 6A depicts a normal distribution showing mean and intervals of standard deviation from the mean, with the percentage numbers representing the empirical rule of a normal distribution, according to embodiments provided herein.
Figure 6B:
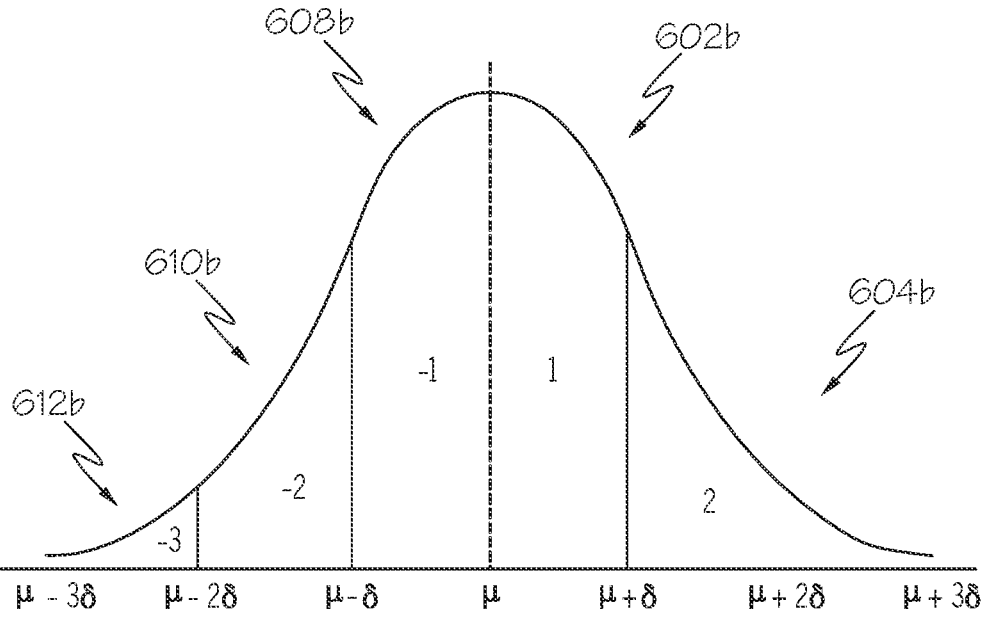
FIG. 6B depicts a standard deviation curve, with positive class divisions representing data higher than the mean and negative class divisions representing values lower than the mean, according to embodiments provided herein.

FIG. 5B depicts a histogram 504 of log-transformed data that demonstrates a normal distribution, according to embodiments provided herein. The general form of probability density function of a normal distribution function is given as:

$$f(x) = \frac{1}{\sigma\sqrt{2\pi}} e^{-\frac{1}{2}\left(\frac{x-\mu}{\sigma}\right)^2}$$  Equation (1)

where f(x) is the probability density function, a is the standard deviation and μ is the mean. FIGS. 6A, 6B, discussed below, shows the characteristics of a normal distribution described with mean and standard deviation.

FIG. 5C depicts an estimated probability density function plotted on the log-transformed histogram 504, according to embodiments provided herein. As illustrated above, Equation 1 may be utilized to determine the estimated PDF of the histogram 504 from FIG. 5B.

FIG. 6A depicts a normal distribution showing mean and intervals of standard deviation from a mean, with the percentage numbers representing the empirical rule of a normal distribution, according to embodiments provided herein. In order to efficiently compartmentalize the wellbore for complex completions, embodiments provided herein perform standard-deviation (SD) based classification. The permeability values 602a that lie above the mean and up to 1 SD are marked as Class 1, the values 604a that are one SD above the mean are marked as Class 2, the values 606a that are two SD above the mean are marked as Class 3. The values 608a below the mean and up to −1 SD are marked as Class −1. The values 610a −1 SD below the mean and up to −2SD are marked as Class −2. All values 612a below −2S D are marked as Class −3. The classification method effectively identifies groups of permeability with similar magnitude. The class values from −3 to 2 are known as Class IDs.

FIG. 6B depicts a standard deviation curve, with positive class divisions representing data higher than the mean and negative class divisions representing values lower than the mean, according to embodiments provided herein. As illustrated, in order to efficiently compartmentalize the wellbore for complex completions, the methodology in this invention performs standard-deviation (SD) based classification. The permeability values 602b that lie above the mean and up to 1 SD are marked as Class 1. The values 604b 1 SD above the mean are marked as Class 2. The values 608b below the mean and up to −1 SD are marked as Class −1. The values 610b −1 SD below the mean and up to −2 SD are marked as Class −2. All values 612b below −2SD are marked as Class −3. The classification method hence effectively identifies groups of permeability with similar magnitude. The class values from −3 to 2 are known as Class IDs. This concept is applied to the automated compartment design process described below.

Figure 7:
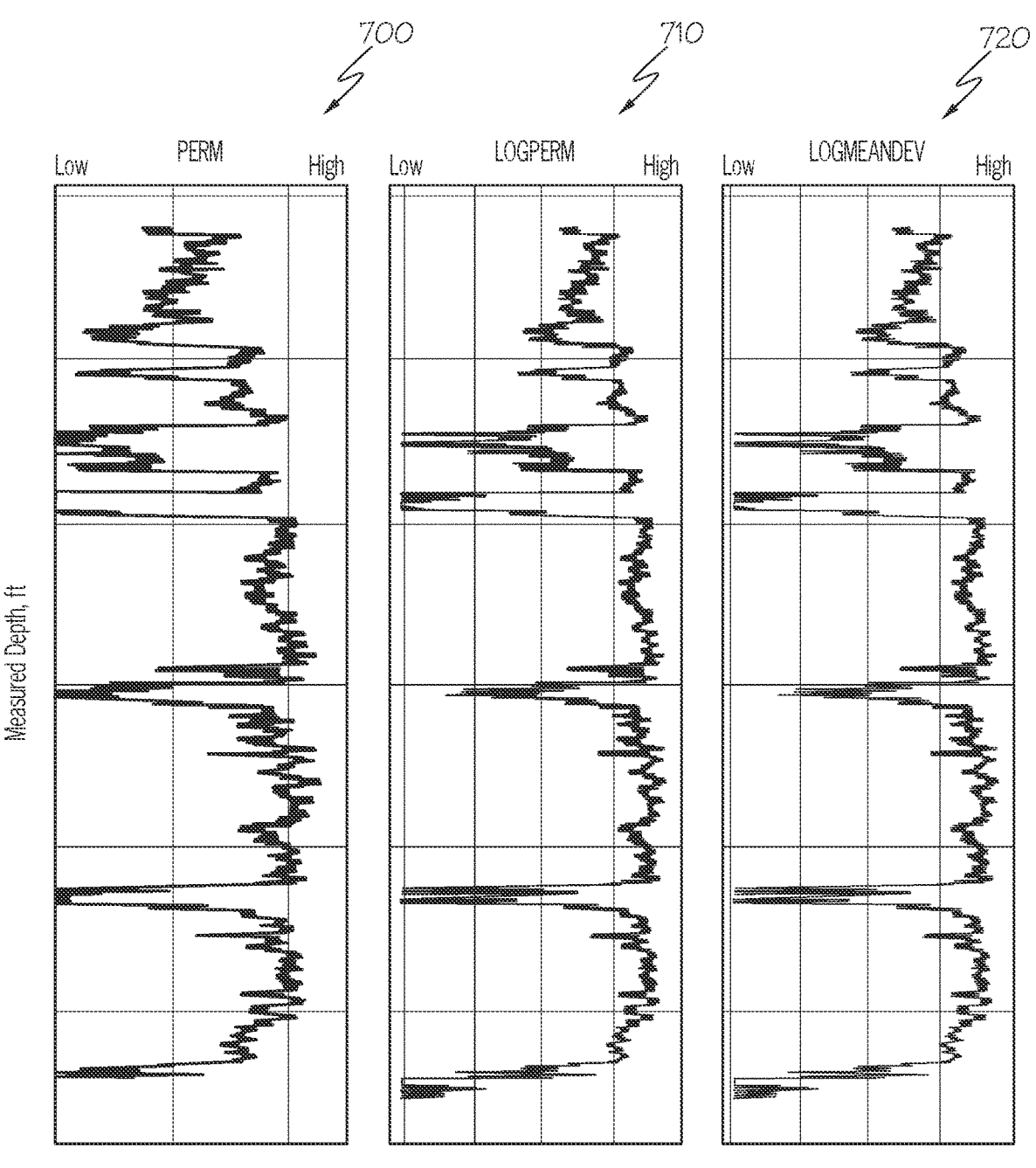
FIG. 7 depicts a plot of distribution of oilfield well permeability versus measured depth, a plot of log-transformed distribution of oilfield well permeability versus measured depth, and a plot of mean deviation distribution of oilfield well permeability versus measured depth, according to embodiments provided herein.

FIG. 7 depicts a plot 700 of distribution of oilfield well permeability versus measured depth, a plot 710 of log-transformed distribution of oilfield well permeability versus measured depth, and a plot 720 of mean deviation distribution of oilfield well permeability versus measured depth, according to embodiments provided herein. As illustrated, there are typically two types of compartment intervals in an ICD completions design of a horizontal well. Specifically, compartments that have ICD for inflow equalization and blank pipe compartments where no ICD devices are installed. The later compartment type is usually designed for intervals where permeability is very low below the permeability cut off value for the reservoir 106. The computing device 102 may be configured to automatically identify both types of compartment intervals along the horizontal section of an oilfield wellbore.

At least one embodiment takes permeability data with respect to the MD of the wellbore (log) as input (plot 700) and performs logarithmic transformation to the data with a logarithm of base 10 (plot 710). Any zero or undefined values are replaced with the minimum non-zero value of the data before log transformation. Then, the mean and standard deviation of the data are calculated and then, the mean deviation is calculated, known as LOGMEANDEV, for every point in the dataset as below;

$$\text{LOGMEANDEV} = x - \mu$$  Equation (2)

where x is the log-transformed permeability data.

Figure 8:
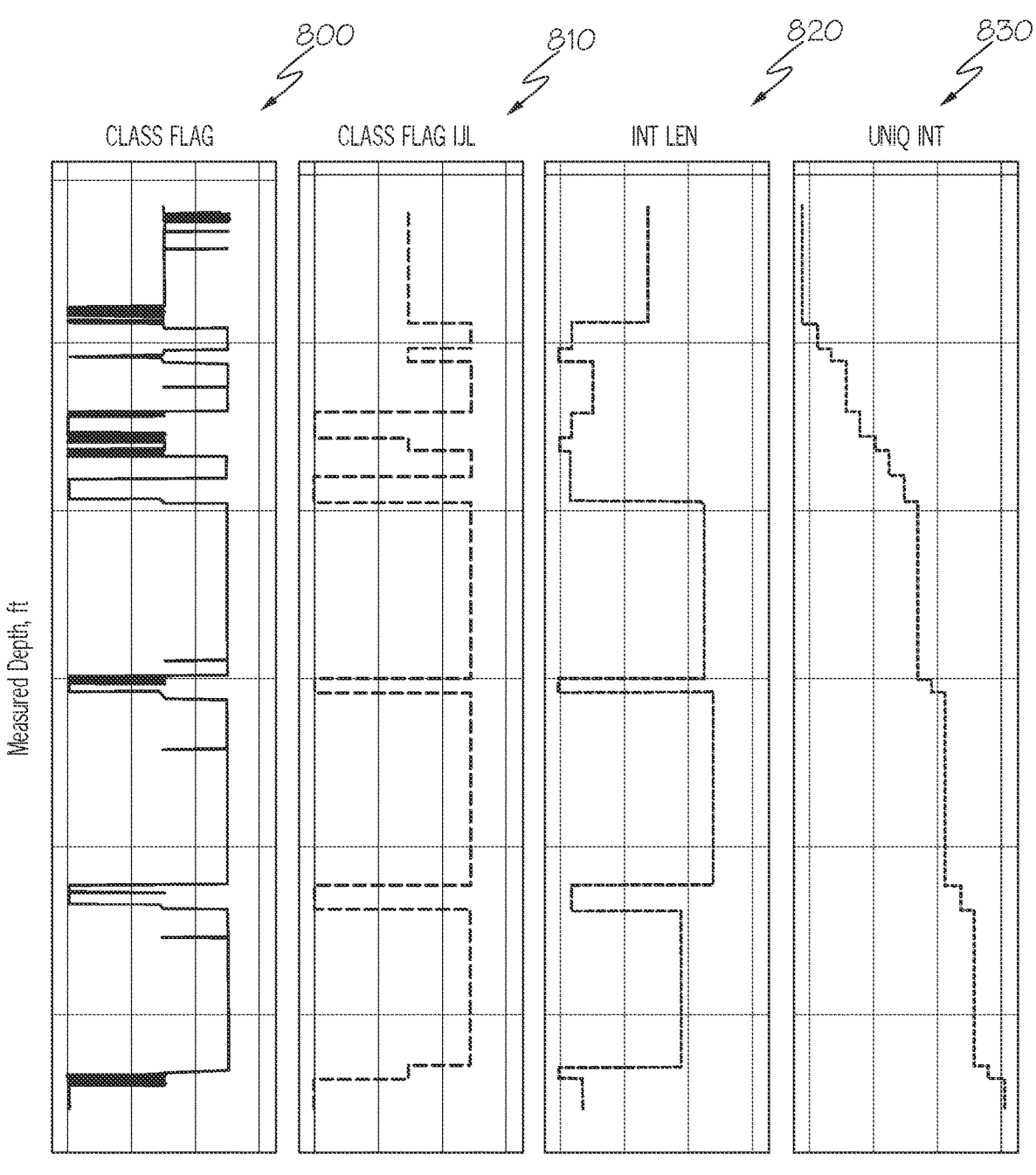
FIG. 8 depicts a class flag versus measured depth plot, a class flag 1JL versus measured depth plot, a unique intervals versus measured depth plot, and normalized individual lengths versus measured depth plot, according to embodiments provided herein.

FIG. 8 depicts a plot 800 for class flag versus measured depth plot, a plot 810 for class flag 1JL versus measured depth plot, a plot 820 for unique intervals versus measured depth plot, and a plot 830 for normalized individual lengths versus measured depth plot, according to embodiments provided herein. Continuing from the process in FIG. 7, these embodiments create a classifier array known as the CLASS_FLAG (plot 800), where for each value of LOGMEANDEV a sample is classified based on standard deviation classification from plot 710 (FIG. 7). The computing device 102 also receives an input of a permeability cut off value from user and any values below the cut off are assigned a Class −4, which identifies blank pipe compartment intervals. A data point before or after the data array (null interval) is considered a class ID value of 0.

Embodiments may additionally calculate maximum compartment intervals, "Imax", that can be physically installed in the target wellbore which is a function of the joint length of completions tubing taken as an input from the user. The relationship to calculate is as follows:

$$I_{max} = \left\lceil \frac{N}{S*J} \right\rceil$$  Equation (3)

where "J" is the joint length given in feet, "S" is the number of samples per feet and "N" is the total number of data sample values in the input permeability array.

The computing device 102 may additionally smooth the CLASS_FLAG array (plot 800) using sliding window process employing a "most-of" methodology. The selected window size may be equal to about 1 joint length. For each window, the computing device 102 calculates a maximum number of samples of each Class ID and assigns a new value to the window equal to the Class ID with maximum samples. The new array is known as CLASS_FLAG_1JL (plot 810).

The CLASS_FLAG_1JL array (plot 810) identifies intervals of similar permeability magnitude (SD-based Classes) with a length equal to about one joint length of tubing. However, this may not be suitable to be used for compartments design as it can result in a recommendation for a very large number of compartments especially for heterogeneous wellbores. In some operational deployments, a large number of compartments are not desired due to operational constraints and cost. Therefore, embodiments further process the CLASS_FLAG_1JL to reduce the number of compartments to practical level. To process this array further, the computing device 102 calculates a plurality of new arrays, or the number of unique intervals in the CLASS_FLAG_1JL array, UNIQ_INT (plot 830) and the corresponding length of each unique interval, INT_LEN (plot 820). The computing device 102 also receives a minimum compartment length as input from the user. Any UNIQ_INT (plot 830) that has a INT_LEN (plot 820) less than that the minimum compartment length is marked as noise that needs to be further processed.

Figure 9A:
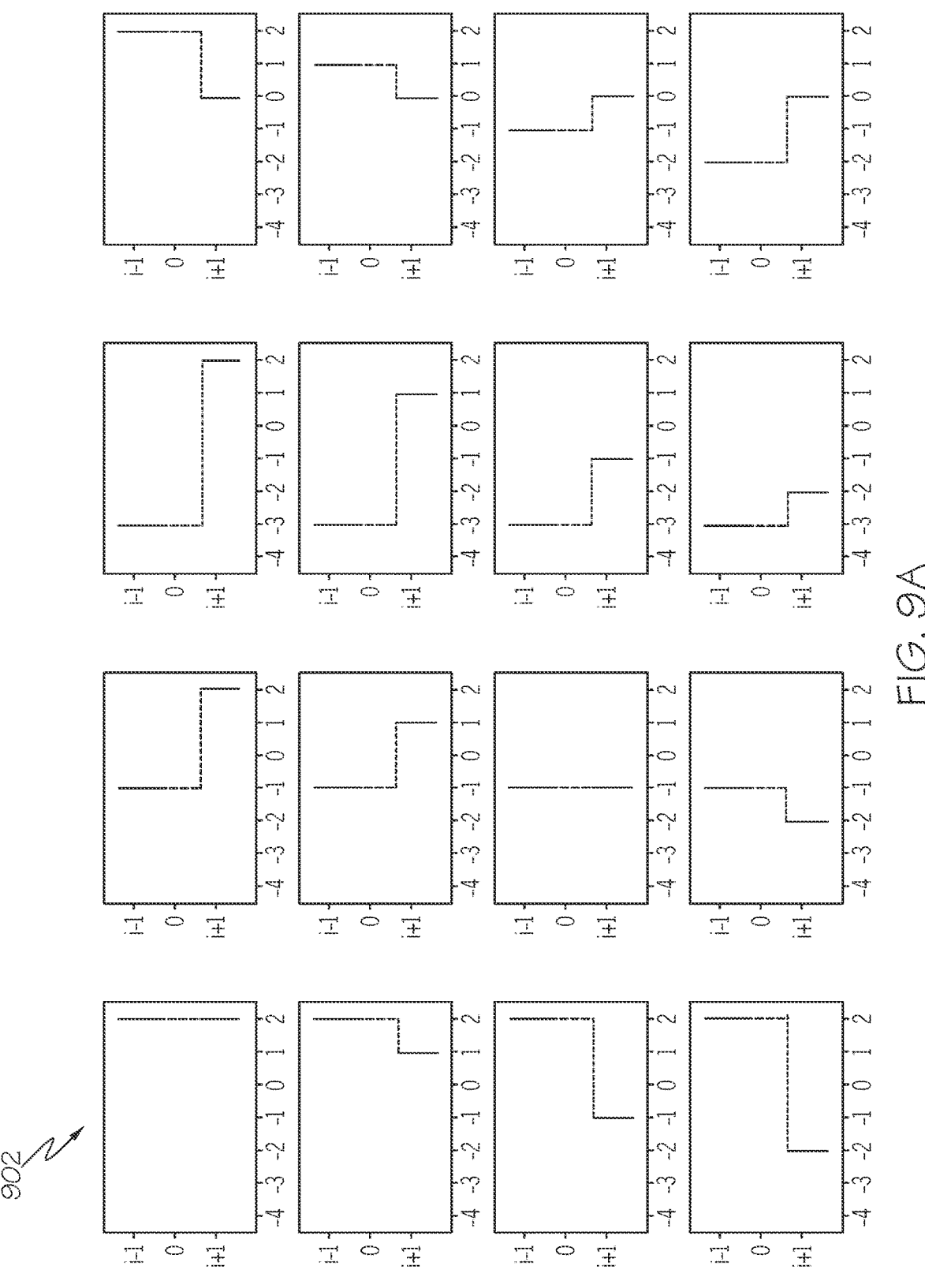
FIGS. 9A-9C depict plots showing signal patterns, according to embodiments provided herein.
Figure 9B:
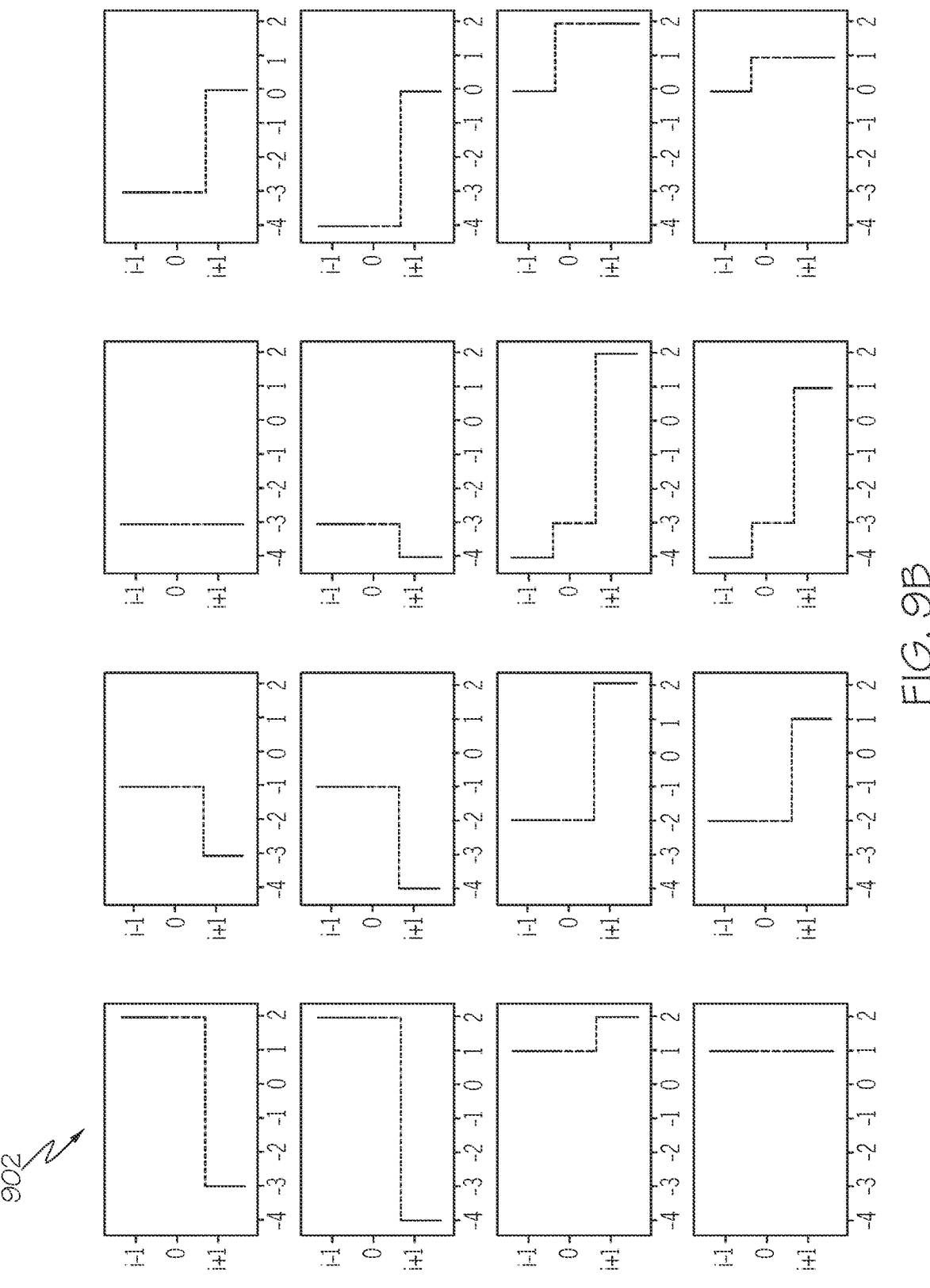
Figure 9C:
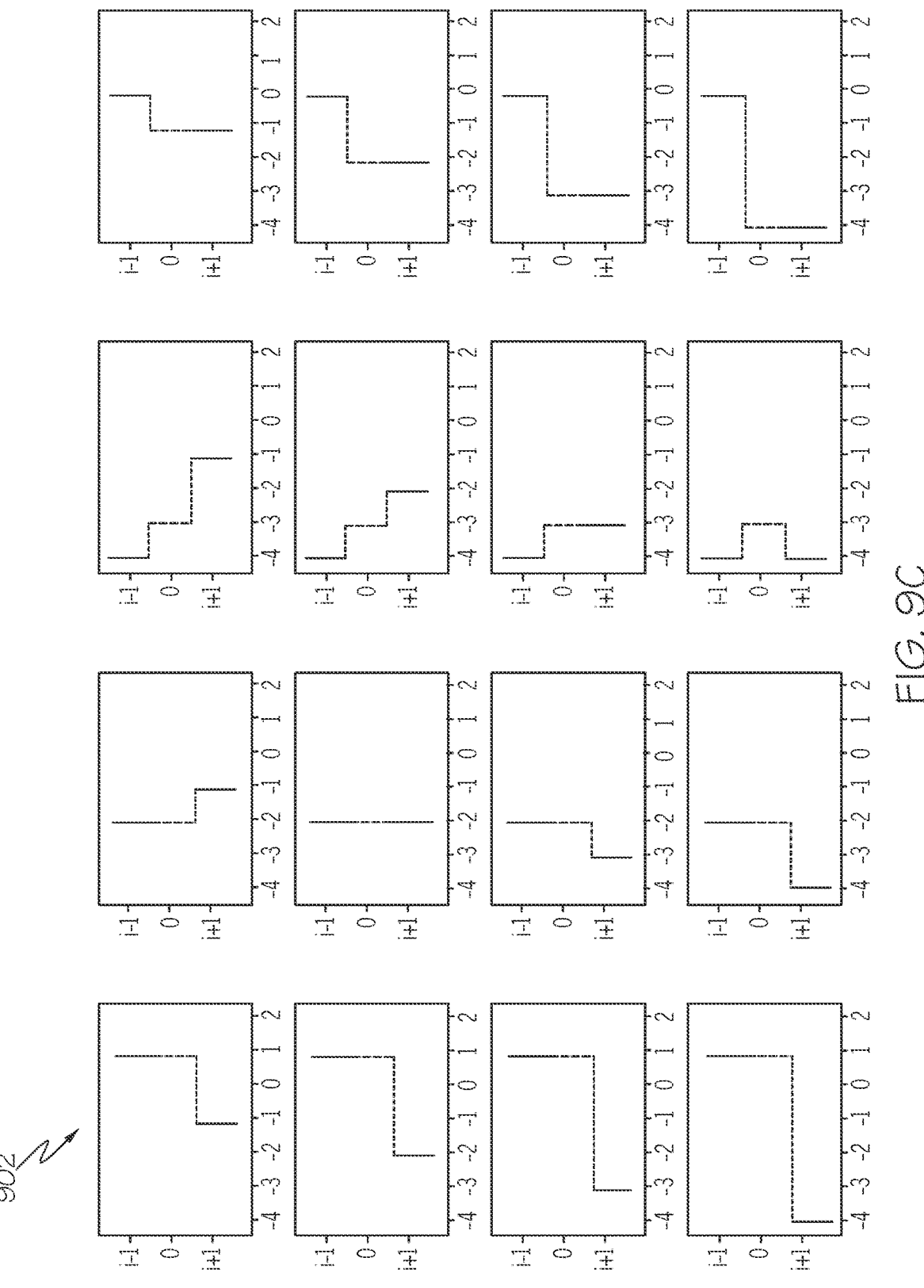

FIGS. 9A-9C depict plots 902 showing signal patterns, according to embodiments provided herein. As illustrated, the x-axis represents the class IDs and "i−1," "i+1" on the y-axis represent the intervals preceding and following the noise interval respectively. "o" represents the class value that is assigned to the noise based on the pattern of i−1, i+1. Please note that a class ID value of 0 represents a null interval. A null interval may include any point before or after data array. All 48 patterns in the library are shown in FIGS. 9A and 9B.

At this stage, the computing device 102 employs a pattern recognition technique to process noise (small intervals less than minimum compartment length) in CLASS_FLAG_1JL based on a pre-defined library of patterns. A pattern is comprised of Class ID values of the preceding interval "i−1" and the following interval "i+1". Based on this pattern, a Class ID value is assigned to the noise (small interval) given by "o". After a pattern is read, it is matched with pre-defined patterns in the pattern library and the noise interval is updated with the corresponding value of Class ID "o" associated with the pattern. As illustrated, "i−1" represents the Class ID of the preceding interval, "i+1" represents the Class ID of the following interval and "o" in red color represents the value that will be assigned to the noise (small interval) after pattern recognition processing.

Figure 10:
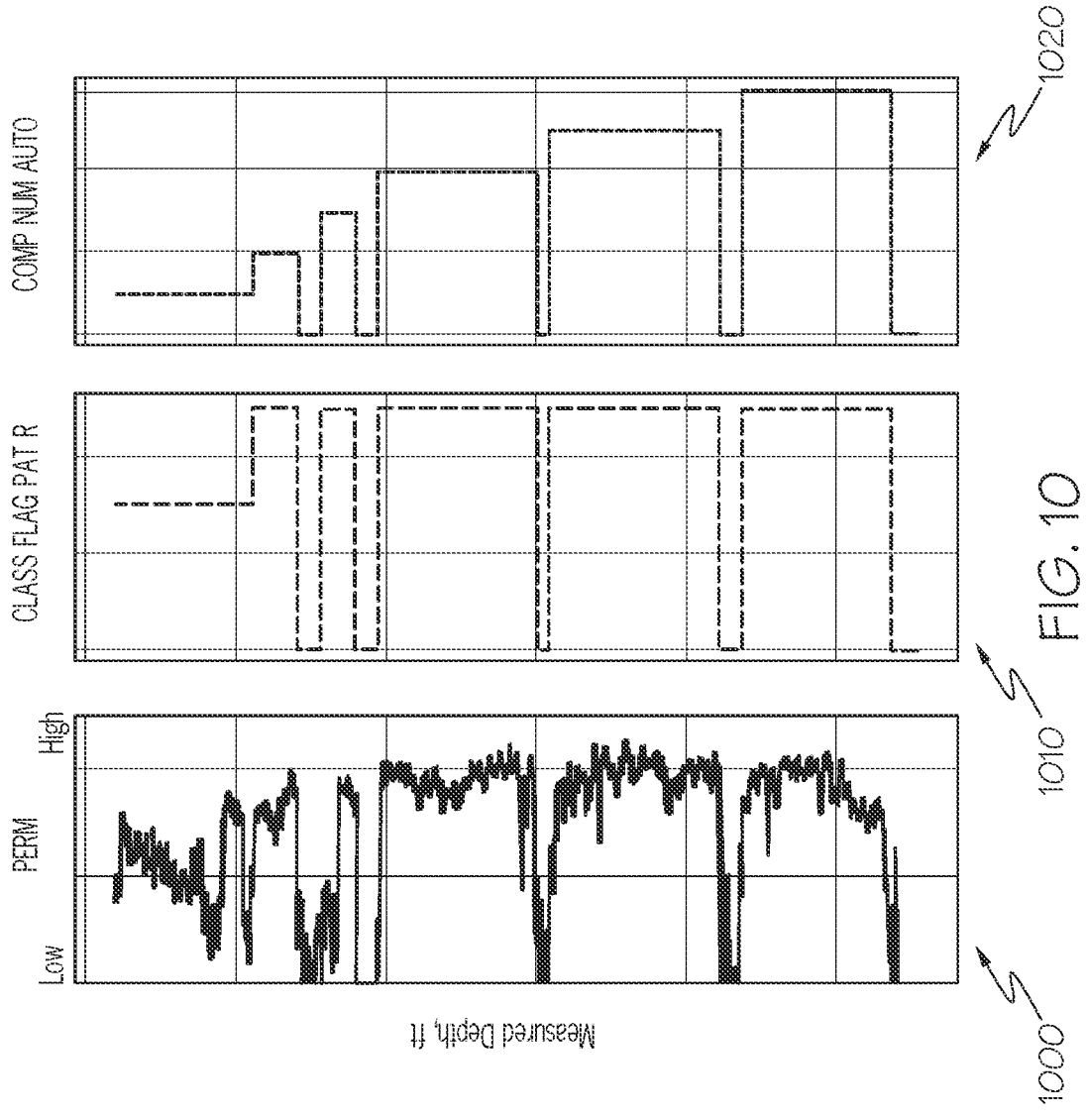
FIG. 10 depicts plots of input permeability versus measured depth, the final class flag versus measured depth after pattern recognition processing, and an output compartment identifier array versus measured depth, according to embodiments provided herein.

FIG. 10 depicts a plot (1000) of input permeability versus measured depth, a plot (1010) of the final class flag versus measured depth after pattern recognition processing, and a plot (1020) of an output compartment identifier array versus measured depth, according to embodiments provided herein. As illustrated, the pattern recognition processing results in a new final array known as CLASS_FLAG_PAT_R (plot 1010) that groups similar magnitudes of permeability based on standard-deviation based classification. The computing device 102 may additionally generate an output array known as COMP_NUM_AUTO (plot 1020). The COMP_NUM_AUTO (plot 1020) is exported as a 2-D array along with measured depth of the wellbore. The values of 1 to N specify the compartment number where N is the maximum compartments identified by the computing device 102 and the value of 0 identifies blank pipe compartment intervals.

Figure 11:
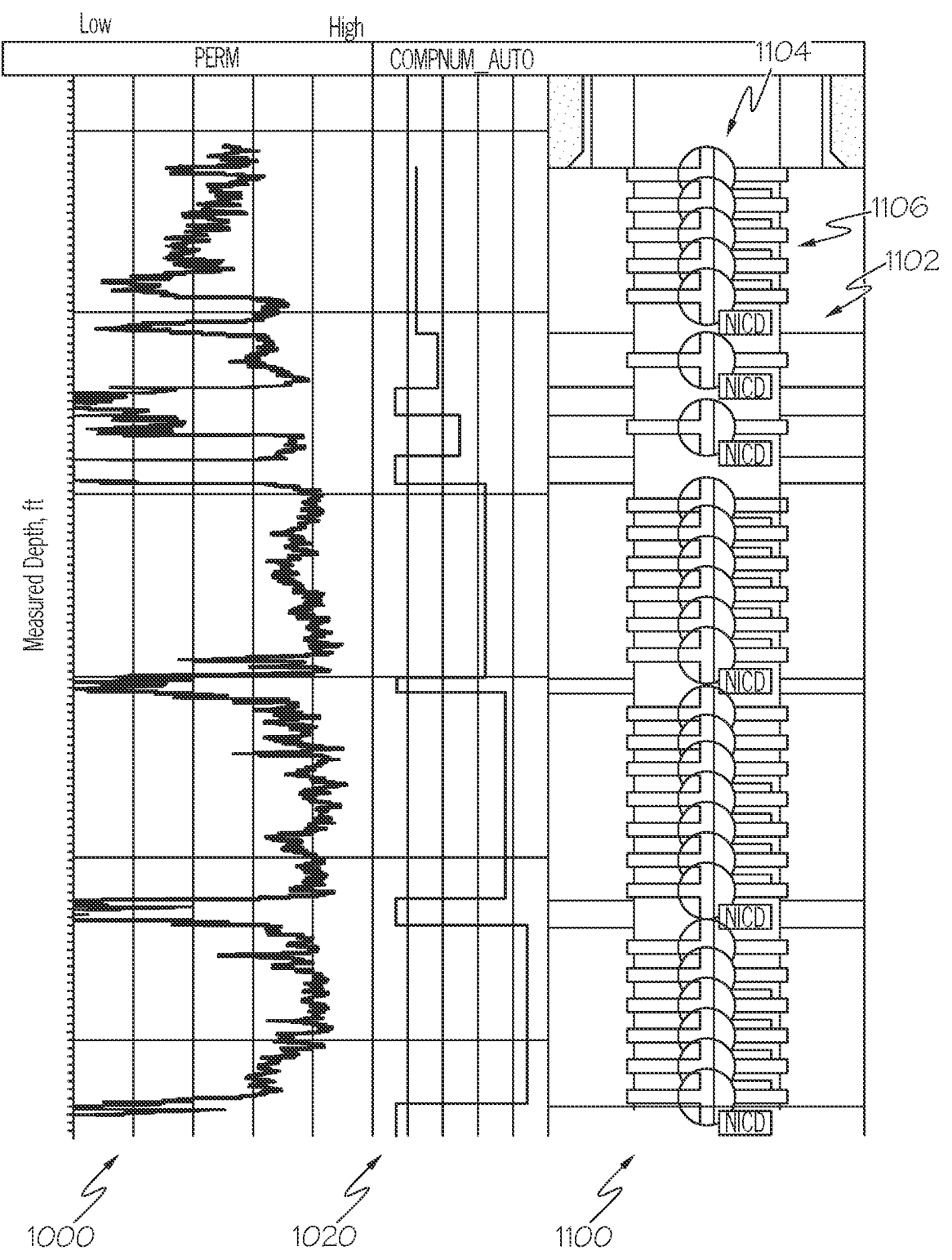
FIG. 11 depicts inflow control device completions design versus measured depth, with compared with the input permeability and final class flag plots from FIG. 8, according to embodiments provided herein.

The output compartment identifier array can be utilized by users for manual design of ICD completions or can be used as an input to an automated ICD completions design software. FIG. 11 illustrates the COMP_NUM_AUTO (plot 1020) array being used in the ICD completions design for a horizontal well.

FIG. 11 depicts a diagram 1100 of an inflow control device completions design versus measured depth, with compared with the plot 1000 for input permeability and the plot 1020 for final class flag from FIG. 10, according to embodiments provided herein. The computing device 102 may at least one define reservoir isolation packer 1102, which are represented in diagram 1100 as horizontal lines.

Inflow completion devices 1104 are represented in diagram 1100 with round disc icons. Also depicted are nozzle ICDs (NICDs) 1106.

Figure 12A:
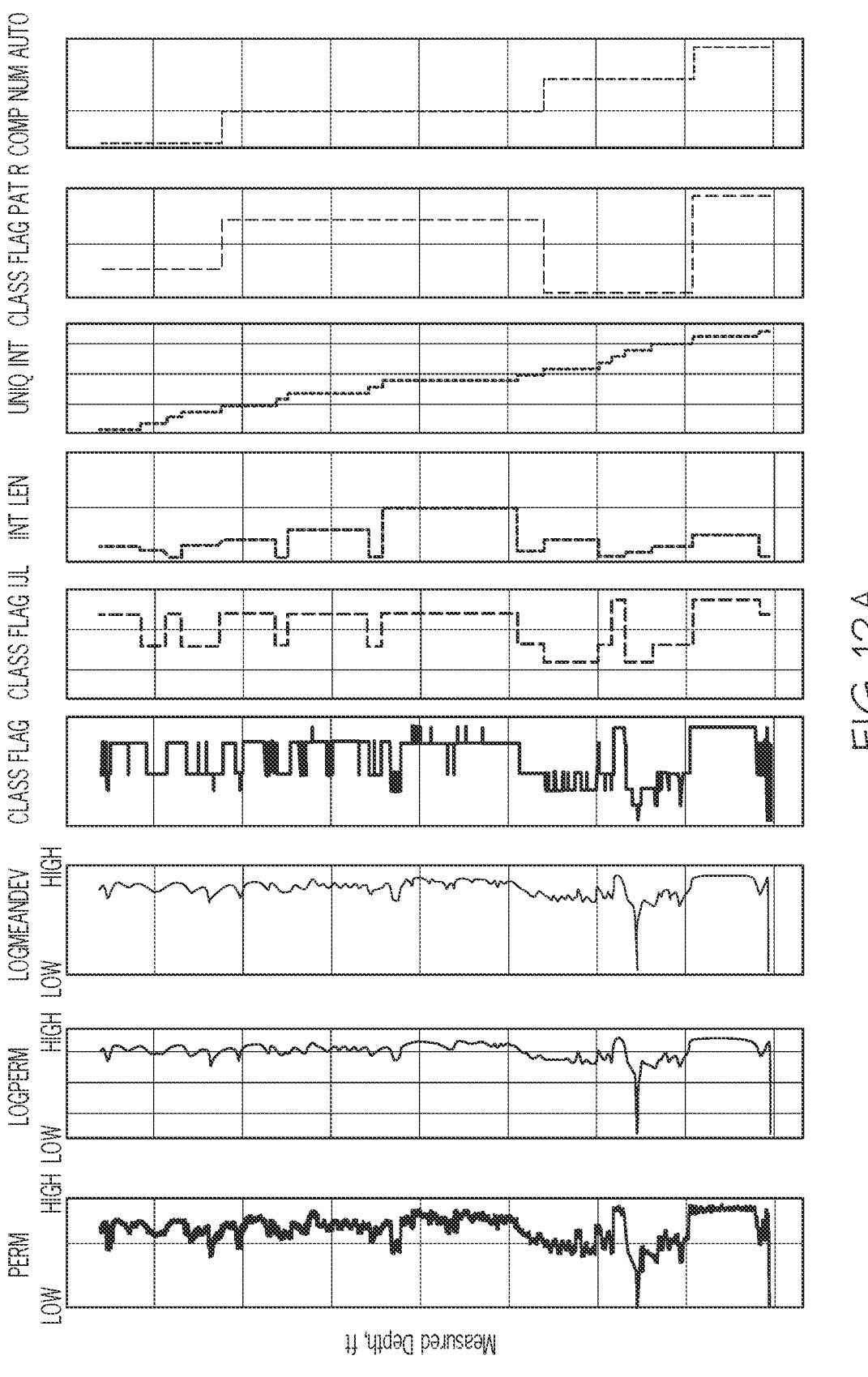
FIGS. 12A-12C depict various plots for analysis provided in FIGS. 5, 6, 8, and 9, applied to different wells, according to embodiments provided herein.
Figure 12B:
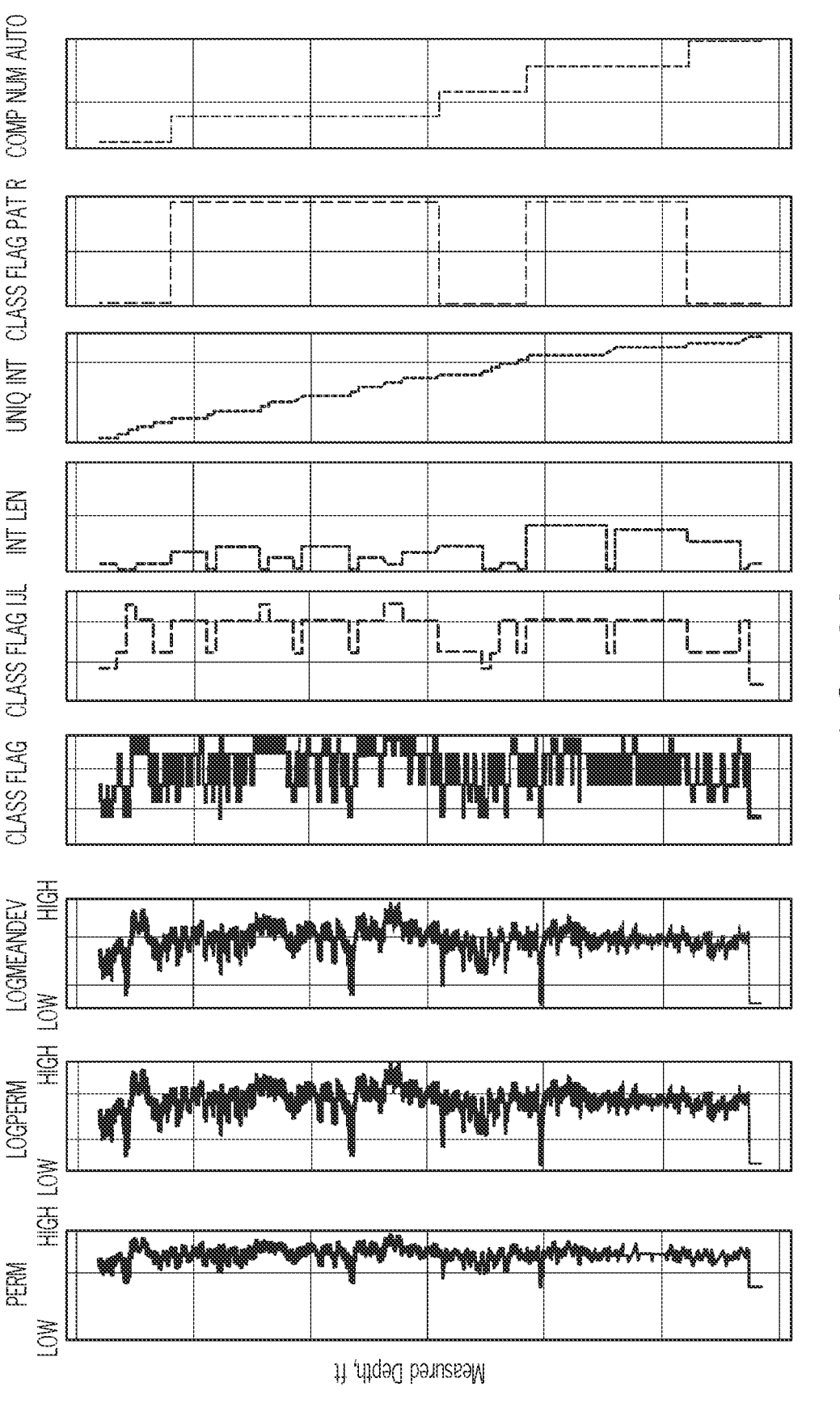
Figure 12C:
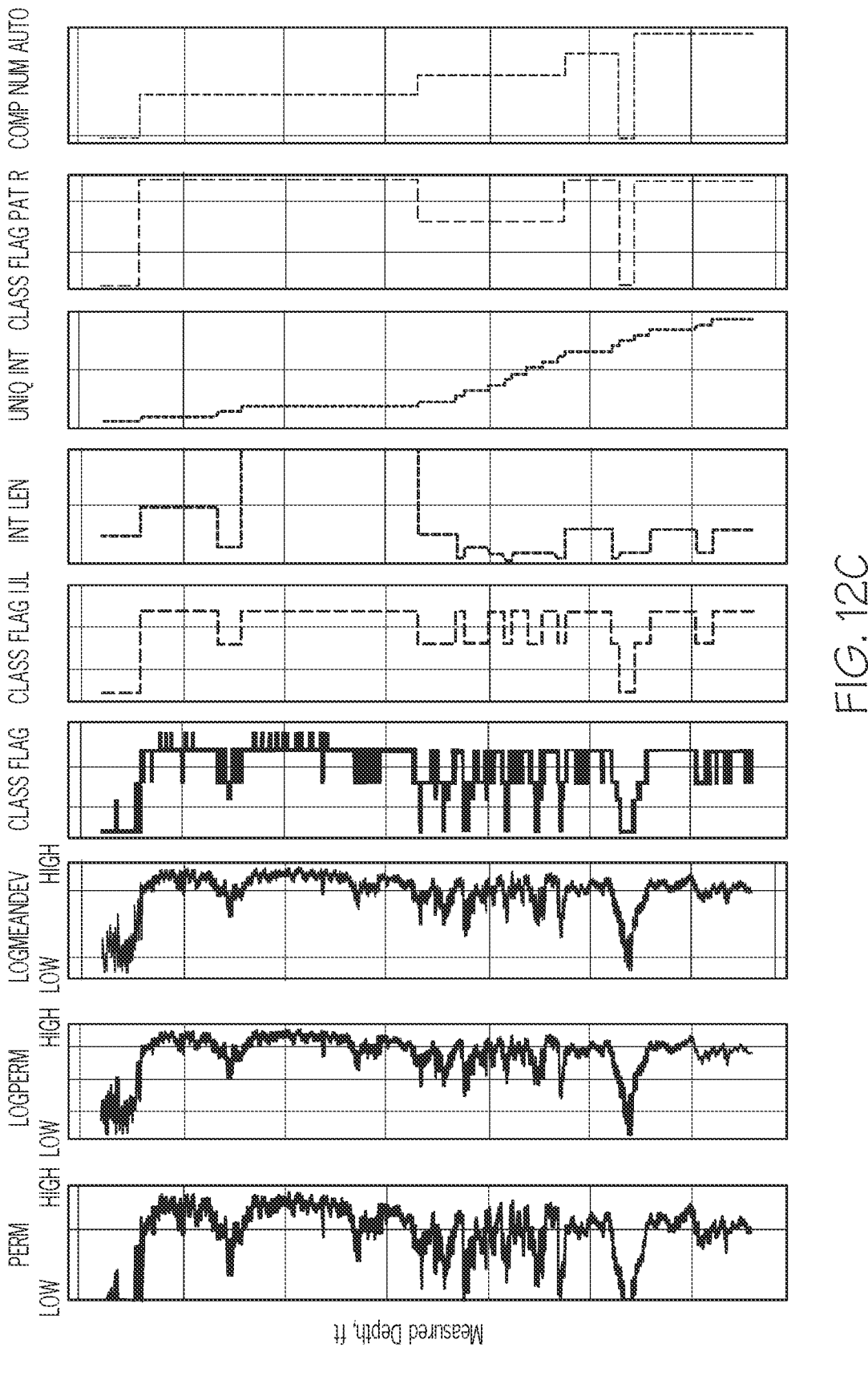

FIGS. 12A-12C depict various plots for analysis provided in FIGS. 7, 8, 10, and 11, applied to different wells, according to embodiments provided herein. As illustrated all three wells of FIGS. 12A-12C have been processed with the process described above, using the following input parameters while the only change is the input permeability versus measured depth data.

Length of a completion tubing joint=38 ft.

Minimum length of a compartment=4.

Permeability cut-off value for blank pipe compartment=1 mD.

FIG. 13 depicts a flowchart for selecting a design simulation, according to embodiments provided herein. As illustrated in block 1350, a reservoir simulation model is generated by the computing device 102. In block 1352, using the simulation model, properties of a reservoir associated with a target well may be predicted, where the properties relate to a trajectory of the well. In block 1354, a plurality of open hole design simulations are generated. In block 1356, representations of a plurality of compartments in the target well may be generated, where the representations are automatically generated without user intervention using a synthetic production logging profile and the properties of the reservoir associated with the target well, where the synthetic production logging profile is based on fluid flow data estimations along the trajectory of the target well.

In block 1358, a first design simulation and a second design simulation are generated automatically and without user intervention. The simulations may be based on the synthetic production logging profile and the properties of the profile of the target well. The first design simulation includes representations of a first plurality of n-flow devices and the second simulation includes different representations of a second plurality of n-flow devices may be based on density parameters and cross-sectional area parameters. In block 1360, case selection factors may be generated automatically and without user intervention. The case selections factors may be associated with each of the first design simulation and the second design simulation. In block 1362, the case selection factors may be ranked automatically and without user intervention. In block 1364, at least one of the first design simulation and the second design simulation may be selected, based on the ranking, automatically and without user intervention.

Figure 14:
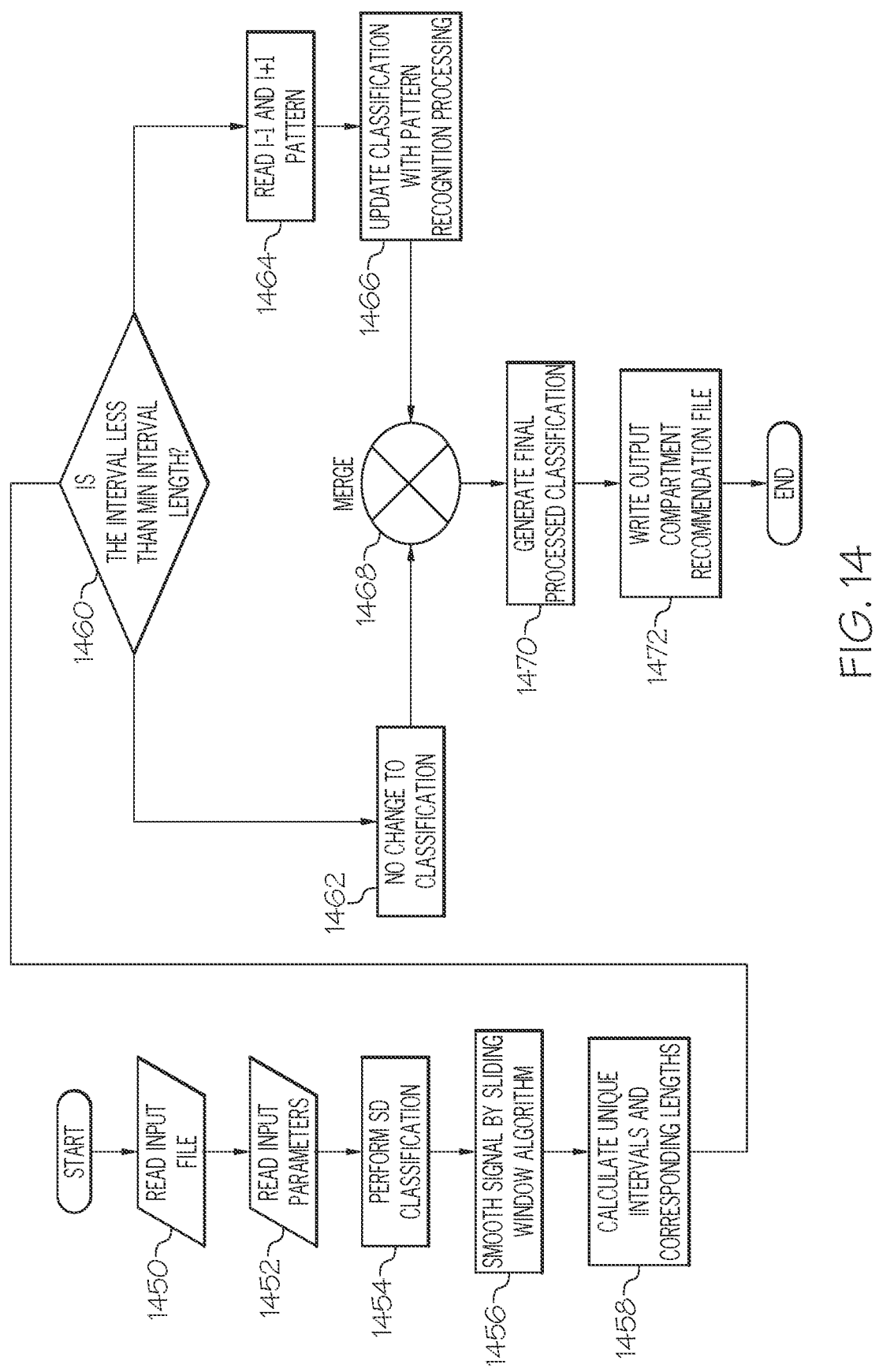
FIG. 14 depicts a flowchart for statistical classification and pattern recognition for compartment design in horizontal oil wells, according to embodiments provided herein.

FIG. 14 depicts a flowchart for statistical classification and pattern recognition for compartment design in horizontal oil wells, according to embodiments provided herein. As illustrated in block 1450, an input file may be read. As discussed above, the input file may include well permeability log file (permeability versus measured depth), well target entry depth (TE-DEPTH), length of a completion tubing joint (J), minimum length of a compartment (L), permeability cut-off value (K-MIN), and/or other data.

In block 1452, the input parameters are read. In block 1454, a standard deviation classification may be performed, as described with reference to FIGS. 6A and 6B. In block 1456, a sliding window process may be executed to smooth the signal. In block 1458, unique intervals and corresponding lengths of the ICD may be calculated. In block 1460, a determination is made regarding whether the interval is less than a minimum interval length. The minimum length of a compartment may be measured as units of joint length. If not, at 1462, no change in classification is made.

If the interval is less than a minimum interval length at block 1460, at block 1464, the computing device 102 reads the patterns from FIGS. 9A and 9B. In block 1466, the classification is updated with pattern recognition processing.

In block 1468, the information from block 1462 and block 1466 are merged. In block 1470, a final processed classification is generated. In block 1472, an output compartment recommendation file is written by the computing device 102.

FIG. 15 depicts an additional flowchart for statistical classification and pattern recognition for compartment design in horizontal oil wells, according to embodiments provided herein. As illustrated in block 1550, an input parameter for a target well may be received (such as user input), where the input parameter includes a well permeability log for the target well. In block 1552, a log transformation is performed on the permeability log to create transformed data. In block 1554, a mean and a standard deviation of the transformed data is performed.

In block 1556, a classification flag is generated that classifies the permeability log, based on the standard deviation. In block 1558, noise from the permeability log may be classified. In block 1560, the noise may be transformed, based on a predefined pattern library. In block 1562, a final transformed signal may be created from the classification flag and the noise. In block 1564, a compartment design array may be generated from the final transformed signal that provides recommended compartment intervals versus the measured depth of the target well.

Figure 16:
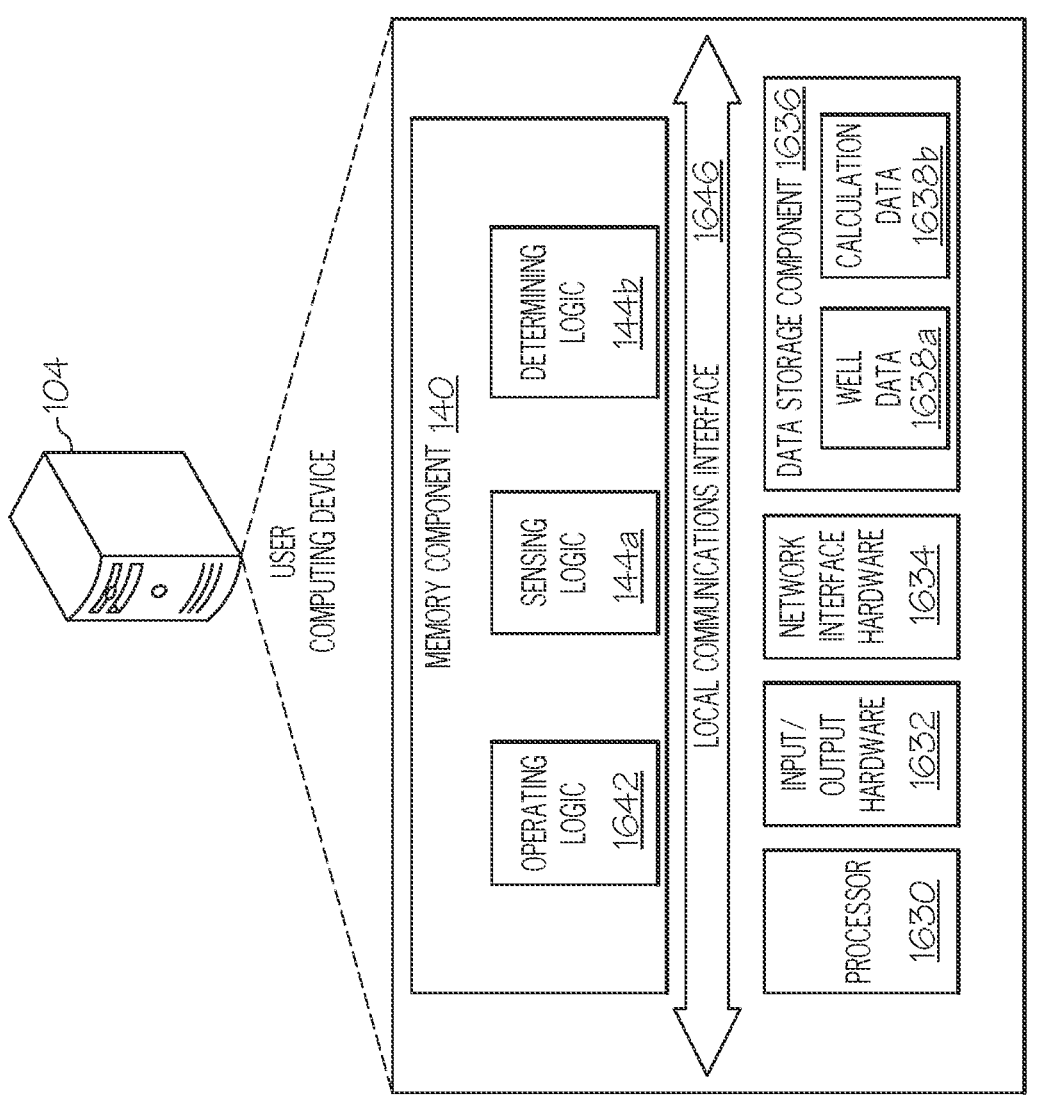
FIG. 16 depicts a computing device for statistical classification and pattern recognition for compartment design in horizontal oil wells, according to embodiments provided herein.

FIG. 16 depicts a computing device for statistical classification and pattern recognition for compartment design in horizontal oil wells, according to embodiments provided herein. As illustrated, the computing device 102 includes a processor 1430, input/output hardware 1432, a network interface hardware 1434, a data storage component 1436 (which stores well data 1438a, calculation data 1438b, and/or other data), and a memory component 140. The memory component 140 may be configured as volatile and/or nonvolatile memory and as such, may include random access memory (including SRAM, DRAM, and/or other types of RAM), flash memory, secure digital memory, registers, compact discs (CD), digital versatile discs (DVD) (whether local or cloud-based), and/or other types of non-transitory computer-readable mediums. Depending on the particular embodiment, these non-transitory computer-readable mediums may reside within the computing device 102 and/or external to the computing device 102.

The memory component 140 may store operating logic 1442, the sensing logic 144a and the determining logic 144b. Each of these logic components may include a plurality of different pieces of logic, each of which may be embodied as a computer program, firmware, and/or hardware, as an example. A local interface 1446 is also included in FIG. 14 and may be implemented as a bus or other communication interface to facilitate communication among the components of the computing device 102.

The processor 1430 may include any processing component operable to receive and execute instructions (such as from a data storage component 1436 and/or the memory component 140). As described above, the input/output hardware 1432 may include and/or be configured to interface with speakers, microphones, and/or other input/output components.

The network interface hardware 1434 may include and/or be configured for communicating with any wired or wireless networking hardware, including an antenna, a modem, a LAN port, wireless fidelity (Wi-Fi) card, WiMAX card, mobile communications hardware, and/or other hardware for communicating with other networks and/or devices. From this connection, communication may be facilitated between the computing device 102 and other computing devices.

The operating logic 1442 may include an operating system and/or other software for managing components of the computing device 102. As discussed above, the sensing logic 144a may reside in the memory component 140 and may be configured to cause the processor 1430 to interpret signals from the sensor 108. The determining logic 144b may be configured to cause the processor 1430 to utilize the data from the sensing logic 144a to likelihood of success for a desired logging option (as well as provide other functionality provided herein).

It should be understood that while the components in FIG. 14 are illustrated as residing within the computing device 102, this is merely an example. In some embodiments, one or more of the components may reside external to the computing device 102 or within other devices. It should also be understood that, while the computing device 102 is illustrated as a single device, this is also merely an example. In some embodiments, the sensing logic 144a and the determining logic 144b may reside on different devices.

Additionally, while the computing device 102 is illustrated with the sensing logic 144a and the determining logic 144b as separate logical components, this is also an example. In some embodiments, a single piece of logic may provide the described functionality. It should also be understood that while the sensing logic 144a and the determining logic 144b are described herein as the logical components, this is also an example. Other components may also be included, depending on the embodiment.

Accordingly, embodiments of this disclosure include the following aspects:

A first aspect includes a method for application of statistical classification and pattern recognition for compartment design in horizontal oil wells comprising: receiving, by a computing device, an input parameter for a target well, wherein the input parameter includes a permeability log for the target well; performing, by the computing device, a log transformation on the permeability log to create transformed data; calculating, by the computing device, a mean and a standard deviation of the transformed data; generating, by the computing device, a classification flag that classifies the permeability log, based on the standard deviation; classifying, by the computing device, noise from the permeability log; transforming, by the computing device, the noise based on a predefined pattern library; creating, by the computing device, a final transformed signal from the classification flag and the noise; and generating, by the computing device, a compartment design from the final transformed signal that provides a recommended compartment interval versus measured depth of the target well.

A second aspect includes the method the first aspect, wherein the input parameter further includes at least one of the following: a well target entry depth, a length of a completion tubing joint, a minimum length of a compartment, or a permeability cut-off value.

A third aspect includes the method of any of the first aspect and/or the second aspect, wherein the classification flag is created at a log sampling resolution.

A fourth aspect includes the method of any of the first aspect through the third aspect, further comprising transforming the classification flag to a resolution of one joint length of a completion design.

A fifth aspect includes the method of any of the first aspect through the fourth aspect, wherein performing the log transformation includes performing a statistical analysis of permeability log for the target well.

A sixth aspect includes the method of any of the first aspect through the fifth aspect, wherein the noise is classified based on a pattern of interval−1 and interval+1 value.

A seventh aspect includes the method of any of the first aspect through the sixth aspect, further comprising receiving user input of a permeability cut off value and values below a predetermined cutoff are assigned a class −4, which identifies blank pipe compartment intervals.

An eighth aspect includes the method of any of the first aspect through the seventh aspect, further comprising calculating a maximum compartment interval, that can be physically installed in the target well, wherein the maximum compartment interval is a function of a joint length of completions tubing received as user input.

A ninth aspect includes the method of any of the first aspect through the eighth aspect, further comprising calculating the maximum compartment interval, $I_{max}$ as:

$$I_{max} = \left\lceil \frac{N}{S*J} \right\rceil,$$

where "J" is a joint length given in feet, "S" is a number of samples per feet and "N" is a total number of data sample values in an input permeability array.

A tenth aspect includes the method of any of the first aspect through the ninth aspect, further comprising smoothing the classification flag using a sliding window with a selected window size equal to about 1 joint length.

An eleventh aspect includes the method of any of the first aspect through the tenth aspect, further comprising grouping similar magnitudes of permeability based on standard-deviation based classification to create the final transformed signal.

A twelfth aspect includes the method of any of the first aspect through the eleventh aspect, further comprising defining a reservoir isolation packer, an inflow completion device, and a nozzle inflow control device (NICD).

A thirteenth aspect includes a system for application of statistical classification and pattern recognition for compartment design in horizontal oil wells comprising: drilling equipment for drilling a target well, wherein the target well is a horizontal well, wherein the drilling equipment includes a special purpose computing device that includes a memory component that stores logic, that when executed by the special purpose computing device, causes the system to perform at least the following: receive an input parameter for the target well, wherein the input parameter includes a permeability log for the target well; perform a log transformation on the permeability log to create transformed data; calculate a mean and a standard deviation of the transformed data; generate a classification flag that classifies the permeability log, based on the standard deviation; classify noise from the permeability log; transform the noise based on a predefined pattern library; create a final transformed signal from the classification flag and the noise; and generate a compartment design from the final transformed signal that provides recommended compartment intervals versus measured depth of the target well.

A fourteenth aspect includes the system of the thirteenth aspect, wherein the input parameter further includes at least one of the following: a well target entry depth, a length of a completion tubing joint, a minimum length of a compartment, or a permeability cut-off value.

A fifteenth aspect includes system of any of the thirteenth and/or fourteenth aspect, wherein the noise is classified based on a pattern of interval−1 and interval+1 value.

A sixteenth aspect includes the system of any of the thirteenth aspect through the fifteenth aspect, wherein the logic further causes the system to receive user input of a permeability cut off value and values below a predetermined cutoff are assigned a class −4, which identifies blank pipe compartment intervals.

A seventeenth aspect includes the system of any of the thirteenth aspect through the sixteenth aspect, wherein the logic further causes the system to calculate a maximum compartment interval, that can be physically installed in the target well, wherein the maximum compartment interval is a function of a joint length of completions tubing received as user input.

An eighteenth aspect includes the system of any of the thirteenth aspect through the seventeenth aspect, wherein the logic further causes the system to calculate the maximum compartment interval, $I_{max}$ as:

$$I_{max} = \left\lceil \frac{N}{S*J} \right\rceil,$$

where "J" is a joint length given in feet, "S" is a number of samples per feet and "N" is a total number of data sample values in an input permeability array.

A nineteenth aspect includes drilling equipment for application of statistical classification and pattern recognition for compartment design in horizontal oil wells comprising: a drill for drilling a target well, wherein the target well is a horizontal well; and a computing device that includes a memory component that stores logic, that when executed by the computing device, causes the computing device to perform at least the following: receive an input parameter for the target well, wherein the input parameter includes a permeability log for the target well; perform a log transformation on the permeability log to create transformed data; calculate a mean and a standard deviation of the transformed data; generate a classification flag that classifies the permeability log, based on the standard deviation; classify noise from the permeability log; transform the noise based on a predefined pattern library; create a final transformed signal from the classification flag and the noise; and generate a compartment design from the final transformed signal that provides recommended compartment intervals versus measured depth of the target well.

A twentieth aspect includes the drilling equipment of the nineteenth aspect, wherein the logic further causes the computing device to calculate a maximum compartment interval, that can be physically installed in the target well, wherein the maximum compartment interval is a function of a joint length of completions tubing received as user input, wherein the maximum compartment interval, $I_{max}$ is calculated as:

$$I_{max} = \left\lceil \frac{N}{S*J} \right\rceil,$$

where "J" is a joint length given in feet, "S" is a number of samples per feet and "N" is a total number of data sample values in an input permeability array.

As illustrated above, various embodiments for application of statistical classification and pattern recognition for compartment design in horizontal oil wells are disclosed. Some embodiments include automatically designing well inflow compartments without any human intervention. These embodiments may be configured to perform a statistical analysis of the interpreted permeability log for the target well which is assumed to be log normally distributed. Some embodiments may perform a log transformation on the permeability data. Mean and standard deviation of transformed data may be calculated, which is used in calculation of a new property, log perm mean deviation, by subtracting the mean from the log permeability. A flag signal classifying the log permeability may be generated, based on intervals of standard deviation.

These embodiments may additionally transform the classification flag created at the log sampling resolution to the resolution of one joint length of a completion design using a sliding window process employing a most-of methodology. The signal may be transformed with the application of a pattern recognition methodology that identifies intervals below the user-specified minimum compartment length, then automatically classifies the noise based on a pattern of interval−1 and interval+1 value and in the end further transforms the noise based on a pre-defined pattern library. A compartment design array may also be generated from the final transformed signal that provides recommended compartment intervals versus the measured depth of the target well.

These embodiments may be configured to drastically increase the number of computations that can be performed for a single well or multiple wells. With at least 5-10 input parameters, as well as the other data computed by the computing device, the amount of information would be impossible for a human to calculate, especially considering that the drilling apparatus is highly expensive, so even minimal improvements in time save vast amounts of money.

While particular embodiments and aspects of the present disclosure have been illustrated and described herein, various other changes and modifications can be made without departing from the spirit and scope of the disclosure. Moreover, although various aspects have been described herein, such aspects need not be utilized in combination. Accordingly, it is therefore intended that the appended claims cover all such changes and modifications that are within the scope of the embodiments shown and described herein.

It should now be understood that embodiments disclosed herein include systems, methods, and non-transitory computer-readable mediums for application of statistical classification and pattern recognition for compartment design in horizontal oil wells. It should also be understood that these embodiments are merely exemplary and are not intended to limit the scope of this disclosure.

What is claimed is:

1. A method for application of statistical classification and pattern recognition for compartment design in horizontal oil wells comprising:

receiving, by a computing device, an input parameter for a target well, wherein the input parameter includes a permeability log for the target well;

performing, by the computing device, a log transformation on the permeability log to create transformed data;

calculating, by the computing device, a mean and a standard deviation of the transformed data;

generating, by the computing device, a classification flag that classifies the permeability log, based on the standard deviation;

classifying, by the computing device, noise from the permeability log;

transforming, by the computing device, the noise based on a predefined pattern library;

creating, by the computing device, a final transformed signal from the classification flag and the noise;

generating, by the computing device, a compartment design from the final transformed signal that provides a recommended compartment interval versus measured depth of the target well;

calculating, by the computing device, a maximum compartment interval that can be physically installed in the target well, wherein the maximum compartment interval is a function of a joint length of completions tubing received as user input, wherein the maximum compartment interval, Imax is calculated as:

$$I_{max} = \left\lceil \frac{N}{S*J} \right\rceil,$$

where "J" is a joint length given in feet, "S" is a number of samples per feet and "N" is a total number of data sample values in an input permeability array; and drilling, using drilling equipment, the target well based on the compartment design and the maximum compartment interval.

2. The method of claim 1, wherein the input parameter further includes at least one of the following: a well target entry depth, a length of a completion tubing joint, a minimum length of a compartment, or a permeability cut-off value.

3. The method of claim 1, wherein the classification flag is created at a log sampling resolution.

4. The method of claim 1, further comprising transforming the classification flag to a resolution of one joint length of a completion design.

5. The method of claim 1, wherein performing the log transformation includes performing a statistical analysis of permeability log for the target well.

6. The method of claim 1, wherein the noise is classified based on a pattern of interval−1 and interval+1 value.

7. The method of claim 1, further comprising receiving user input of a permeability cut off value and values below a predetermined cutoff are assigned a class −4, which identifies blank pipe compartment intervals.

8. The method of claim 1, further comprising smoothing the classification flag using a sliding window with a selected window size equal to about 1 joint length.

9. The method of claim 1, further comprising grouping similar magnitudes of permeability based on standard-deviation based classification to create the final transformed signal.

10. The method of claim 1, further comprising defining a reservoir isolation packer, an inflow completion device, and a nozzle inflow control device (NICD).

11. A system for application of statistical classification and pattern recognition for compartment design in horizontal oil wells comprising:

drilling equipment for drilling a target well, wherein the target well is a horizontal well, wherein the drilling equipment includes a special purpose computing device that includes a memory component that stores logic, that when executed by the special purpose computing device, causes the system to perform at least the following:

receive an input parameter for the target well, wherein the input parameter includes a permeability log for the target well;

perform a log transformation on the permeability log to create transformed data;

calculate a mean and a standard deviation of the transformed data;

generate a classification flag that classifies the permeability log, based on the standard deviation;

classify noise from the permeability log;

transform the noise based on a predefined pattern library;

create a final transformed signal from the classification flag and the noise;

generate a compartment design from the final transformed signal that provides recommended compartment intervals versus measured depth of the target well;

calculate a maximum compartment interval that can be physically installed in the target well, wherein the maximum compartment interval is a function of a joint length of completions tubing received as user input, wherein the maximum compartment interval, Imax is calculated as:

$$I_{max} = \left\lceil \frac{N}{S*J} \right\rceil,$$

where "J" is a joint length given in feet, "S" is a number of samples per feet and "N" is a total number of data sample values in an input permeability array; and drill, using the drilling equipment, the target well based on the compartment design and the maximum compartment interval.

12. The system of claim 11, wherein the input parameter further includes at least one of the following: a well target entry depth, a length of a completion tubing joint, a minimum length of a compartment, or a permeability cut-off value.

13. The system of claim 11, wherein the noise is classified based on a pattern of interval−1 and interval+1 value.

14. The system of claim 11, wherein the logic further causes the system to receive user input of a permeability cut off value and values below a predetermined cutoff are assigned a class−4, which identifies blank pipe compartment intervals.

15. Drilling equipment for application of statistical classification and pattern recognition for compartment design in horizontal oil wells comprising:

a drill for drilling a target well, wherein the target well is a horizontal well; and a computing device that includes a memory component that stores logic, that when executed by the computing device, causes the computing device to perform at least the following:

receive an input parameter for the target well, wherein the input parameter includes a permeability log for the target well;

perform a log transformation on the permeability log to create transformed data;

calculate a mean and a standard deviation of the transformed data;

generate a classification flag that classifies the permeability log, based on the standard deviation;

classify noise from the permeability log;

transform the noise based on a predefined pattern library;

create a final transformed signal from the classification flag and the noise;

generate a compartment design from the final transformed signal that provides recommended compartment intervals versus measured depth of the target well; calculate a maximum compartment interval that can be physically installed in the target well, wherein the maximum compartment interval is a function of a joint length of completions tubing received as user input, wherein the maximum compartment interval, Imax is calculated as:

$$I_{max} = \left\lceil \frac{N}{S*J} \right\rceil,$$

where "J" is a joint length given in feet, "S" is a number of samples per feet and "N" is a total number of data sample values in an input permeability array; and drill, using the drill, the target well based on the compartment design and the maximum compartment interval.

\* \* \* \* \*